(12) United States Patent
Nelsen et al.

(10) Patent No.: US 11,307,235 B2
(45) Date of Patent: Apr. 19, 2022

(54) IN-TOOL ESD EVENTS SELECTIVE MONITORING METHOD AND APPARATUS

(71) Applicant: Illinois Tool Works Inc., Glenview, IL (US)

(72) Inventors: Lyle D. Nelsen, San Jose, CA (US); Steven B. Heymann, Los Gatos, CA (US); Mark E. Hogsett, Tiburon, CA (US)

(73) Assignee: Illinois Tool Works Inc., Glenview, IL (US)

( * ) Notice: Subject to any disclaimer, the term of this patent is extended or adjusted under 35 U.S.C. 154(b) by 565 days.

(21) Appl. No.: 15/267,640

(22) Filed: Sep. 16, 2016

(65) Prior Publication Data

US 2017/0131336 A1 May 11, 2017

Related U.S. Application Data

(63) Continuation-in-part of application No. 14/140,860, filed on Dec. 26, 2013, now Pat. No. 9,671,448.
(Continued)

(51) Int. Cl.
*G01R 31/00* (2006.01)
*H02H 1/00* (2006.01)
(Continued)

(52) U.S. Cl.
CPC ......... *G01R 31/001* (2013.01); *G01R 31/002* (2013.01); *G01R 31/2893* (2013.01); *H02H 1/0007* (2013.01); *G01R 35/005* (2013.01)

(58) Field of Classification Search
CPC ............... G01R 23/15; G01R 29/0814; G01R 29/0821; G01R 29/0864; G01R 29/0871;
(Continued)

(56) References Cited

U.S. PATENT DOCUMENTS 2,909,190 A 10/1959 Wilson
5,315,255 A 5/1994 Bettinger
(Continued)

FOREIGN PATENT DOCUMENTS

CN 101278202 10/2008
CN 102394587 3/2012
(Continued)

OTHER PUBLICATIONS

Taiwanese Notice of Allowance, Appln. No. 102149091 dated Nov. 8, 2017 (7 pages).
(Continued)

*Primary Examiner* — Steven L Yeninas
(74) *Attorney, Agent, or Firm* — McAndrews, Held & Malloy, Ltd.

(57) ABSTRACT

An embodiment of the invention provides an apparatus for detecting electrostatic discharges (ESD) events, comprising: an ESD detector configured to determine at least one process window that will permit the ESD detector to detect an ESD event; at least one antenna coupled to said ESD detector; and said ESD detector calibrated for at least one discharge energy. Another embodiment of the invention provides: a method for detecting electrostatic discharges (ESD) events, comprising: determining at least one process window that will permit an ESD detector to detect an ESD event; and calibrating the ESD detector for at least one discharge energy.

18 Claims, 21 Drawing Sheets

Related U.S. Application Data

(60) Provisional application No. 61/747,199, filed on Dec. 28, 2012.

(51) Int. Cl.
*G01R 31/28* (2006.01)
*G01R 35/00* (2006.01)

(58) Field of Classification Search
CPC .... G01R 29/0878; G01R 29/12; G01R 29/24; G01R 31/001; G01R 31/002; G01R 31/003; G01R 31/02; G01R 31/025; G01R 31/1263; G01R 31/302; G01R 35/005; G01R 19/0053; G01R 31/1272; G01R 31/2801; G01R 31/2803; G01R 31/2805; G01R 31/2806; G01R 31/2808; G01R 31/281; G01R 31/2817; G01R 31/2834; G01R 31/2851; G01R 31/2855; G01R 31/2896; G01R 29/08; G01R 29/0807; G01T 1/161; G01T 1/164; H02H 9/046
USPC ............ 324/72, 72.5, 76.13, 76.16, 95, 102, 324/207.16, 227, 382, 452, 456, 457, 458, 324/509, 536, 750.02, 551, 522, 762.01, 324/762.02, 762.03; 340/600, 635, 657, 340/649; 361/91, 112, 113
See application file for complete search history.

(56) References Cited

U.S. PATENT DOCUMENTS

| | | | |
|---|---|---|---|
| 5,430,381 A | 7/1995 | Dower | |
| 5,463,379 A | 10/1995 | Campbell et al. | |
| 5,903,220 A | 5/1999 | Jon | |
| 5,912,184 A | 6/1999 | Young | |
| 5,923,160 A | 7/1999 | DeChiaro | |
| 6,563,316 B2 | 5/2003 | Schauwecker et al. | |
| 7,821,751 B2* | 10/2010 | Mejyr | G06F 1/182 361/56 |
| 8,143,899 B2* | 3/2012 | Younsi | G01R 31/343 324/523 |
| 8,594,957 B2 | 11/2013 | Gauthier et al. | |
| 10,554,203 B1* | 2/2020 | Aras | G01R 19/16552 |
| 2001/0056340 A1 | 12/2001 | Gorin et al. | |
| 2005/0218921 A1* | 10/2005 | Sanda | G01R 31/308 324/762.02 |
| 2005/0258842 A1* | 11/2005 | Maloney | G01R 31/002 324/750.26 |
| 2006/0097337 A1 | 5/2006 | Haji-Sheikh et al. | |
| 2007/0052425 A1 | 3/2007 | Kraz | |
| 2007/0139050 A1 | 6/2007 | Ivanov et al. | |
| 2007/0159186 A1* | 7/2007 | Grund | G01R 27/04 324/678 |
| 2007/0164747 A1 | 7/2007 | Maloney | |
| 2007/0217101 A1 | 9/2007 | Carter | |
| 2008/0169831 A1* | 7/2008 | Lu | G01R 31/2886 324/750.03 |
| 2009/0167313 A1 | 7/2009 | Kraz | |
| 2010/0051692 A1 | 3/2010 | Knudson | |
| 2010/0165537 A1 | 7/2010 | Maloney et al. | |
| 2010/0225346 A1* | 9/2010 | Fefer | G01R 31/002 324/762.02 |
| 2011/0238345 A1 | 9/2011 | Gauthier | |
| 2013/0046502 A1* | 2/2013 | Zhang | G06F 11/2205 702/117 |
| 2013/0285668 A1* | 10/2013 | Savich | G01R 29/24 324/457 |
| 2014/0002098 A1* | 1/2014 | Sales Casals | G01R 31/08 324/521 |
| 2014/0184253 A1 | 7/2014 | Nelsen | |
| 2014/0229129 A1* | 8/2014 | Campbell | H04B 3/548 702/63 |
| 2015/0160282 A1 | 6/2015 | Candela | |
| 2015/0177279 A1* | 6/2015 | Ohtsuka | G01R 31/1272 702/66 |
| 2016/0131697 A1* | 5/2016 | Kang | G11C 29/06 324/750.3 |
| 2019/0056447 A1* | 2/2019 | Candela | G01R 31/08 |

FOREIGN PATENT DOCUMENTS

| | | |
|---|---|---|
| CN | 104583786 | 4/2015 |
| CN | 105074481 | 11/2015 |
| JP | 2003028921 | 1/2003 |
| JP | 2009507245 | 2/2009 |
| JP | 2010117352 | 5/2010 |
| KR | 20150103088 | 9/2015 |
| TW | 200951466 | 12/2009 |
| WO | 2009103315 | 8/2009 |
| WO | 2018052879 | 3/2018 |

OTHER PUBLICATIONS

Japanese Office Action, Appln. No. 2015-550807 dated Oct. 30, 2017 (3 pages).
Int'l Search Report and Written Opinion for Appln. PCT/US2017/051087 dated Nov. 21, 2017 (20 pages).
D.M. Taylor, P.E. Secker "Industrial Electrostatics" published by Research Studies Press LTD. 1994, chapter 8.3, pp. 242-243 (2 pages).
Notification of Transmittal of the ISR and the Written Opinion of the ISA, or the Declaration for PCT/US2013/078038 (dated Apr. 16, 2014) (10 pages).
RF Test Sets: E & H Near Field Probes Model 7405, EMC Test Systems, L.P.—An ESCO Company (Jun. 1999) (2 pages).
T.J. Maloney, "Easy Access to Pulsed Hertzian Dipole Fields Through Pole-Zero Treatment", cover article, IEEE EMC Society Newsletter, Summer 2011, pp. 34-42 (10 pages).
T.J. Maloney, "Antenna Response to CDM E-fields", 2012 EOS/ESD Symposium, Sep. 2012, pp. 269-278 (10 pages).
T.J. Maloney, "Pulsed Hertzian Dipole Radiation and Electrostatic Discharge Events in Manufacturing" 2013 IEEE Electromagnetic Compatibility Magazine, vol. 2, Qrtr 3, pp. 49-57 (10 pages).
Taiwan Search Report Appln No. 106129092 dated Jan. 26, 2021.
Korean Office Action dated Jun. 22, 2021 Appln No. 10-2019-7010595.

\* cited by examiner

1025

Attenuation Factor = 0.0 (0.0 dB)
Rejection ESD Level = 8.0 (mV) = 50V/m @ 24"
Background Pulse Noise Level = 3.0 (mV)
Recommended Antenna Threshold Setting (mV): 30.39
Maximum SNR (mV): 23.01
Note: This is ideal circumstance.

IN-TOOL ESD EVENTS SELECTIVE MONITORING METHOD AND APPARATUS

CROSS-REFERENCE TO RELATED APPLICATIONS

This application is a continuation-in-part of U.S. application Ser. No. 14/140,860, filed 26 Dec. 2013 and entitled "In-tool ESD Events Monitoring Method And Apparatus", which claims priority to and the benefit of U.S. Provisional Application No. 61/747,199.

TECHNICAL FIELD

Embodiments of the invention relate generally to a method and apparatus for in-tool monitoring and characterization of electrostatic discharge (ESD) events, and/or to a CDMES/MiniPulse apparatus and method, and/or other types of charged device model event simulators (CDMES), detectors, and methods. At least one method and apparatus disclosed herein provide real time ESD events monitoring in, for example, integrated circuits (ICs) production tools and/or different processes and assist to prevent ESD related failures using one or more method(s) of the charged device model (CDM). One method of monitoring ESD events and two methods for calibrating the monitor are disclosed herein.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

CDM events represent electrostatic discharges which happen in manual and automated production systems for electronic ICs (integrated circuits). In production tools, the IC (integrated circuit) may acquire electrical charges by many ways, such as, for example, by contact, friction, and/or induction from a nearby electrical field, just to mention a few possible ways. When conductive parts of ICs come into contact with grounded equipment parts or parts with lower electrical potentials, the accumulated IC charges are free to discharge spontaneously. As a result, a relatively high discharge current (ESD event) may destroy or damage the IC (see, e.g., FIGS. 1a and 1b).

The design of IC components usually incorporates special means (or particular components) for protection against ESD effects. The semiconductor industry has developed several standard methods for testing IC devices and defined their CDM ESD threshold parameters such as, e.g., withstand voltage and current amplitude. The applicable standards also detail the test apparatus requirements for automated IC CDM tests. These methods and devices are useful during IC design stages, final testing for product certification, and failure analyses of damaged devices.

However, conventional technology suffers from various constraints and/or deficiencies as will be discussed below. A goal in accordance with various embodiments of this invention is to provide a method and apparatus for real time ESD event monitoring and calibration in IC production tools and manufacturing processes.

FIG. 1a illustrates a typical discharge model 100 of a charged (IC) device CDM event in a tool or processing chamber. In FIG. 1a, the "MiniPulse" (SIMCO-ION) ESD detector 105 (or another type of ESD detector 105) intercepts the ESD signal 140, and the Robot Placement Effector 115 (or another suitable type of robotic arm 115) places a charged device 125 into a test socket 130. The test socket 130 is typically placed on a suitable test bed 131, base 131, or another suitable platform 131. As the charged device 125 approaches the test socket 130, a discharge (ESD) 141 occurs and the antenna 135 which is a part of "MiniPulse" Detector (coupled to the MiniPulse Detector 105) intercepts the ESD signal 140 of the discharge event. In this example, the ESD event is a discharge 141 that takes place in the form of a spark between two conductive parts 125 and 130 that are both characterized by different voltage potentials. The conductive parts 125 and 130 and other semiconductor processing equipment may be in a tool or processing chamber 132 that may have any suitable size such as, for example, approximately 2×2 feet, 4×4 feet, or other dimensions.

One of current problems with conventional technology and instrumentation is in the difficulty in calibrating an ESD detector. This difficulty is due to, for example, the challenge in providing the repeatability of the electrostatic discharge events themselves. Other difficulties exist due to conditions imposed upon detecting of the radiated electrical field waveform by the materials and configuration of the process point itself. Yet another big problem and/or limitation is the relatively high electromagnetic noise level in the tools and IC production floors. Therefore, the current technology and devices are limited in their capabilities for ESD events detection and suffer from at least the above constraints and deficiencies. Embodiments of the invention provide systems and methods for overcoming the difficulties in calibrating the ESD detectors and reliable detection of the ESD events in production conditions.

FIG. 1b shows a screen shot of a typical example voltage/current waveform of a CDM electrostatic event where a discharge takes place in the form of a spark between two conductive parts moving to contact (later named as a "collapsing capacitor"). The top waveform 180 is an example output signal (current pulse that is similar to an example output signal that is produced by a CDMES (Charged Device Model Event Simulator) as will be discussed below in accordance with an embodiment of the invention. The lower waveform 185 is the resulting incident waveform captured by the "MicroESD" monopolar antenna 135.

The "MiniPulse" detector 105 includes an electronic circuit that is capable of receiving the signal that is intercepted by the antenna 135. The electronic circuit will filter/classify this signal as an ESD event if the electronic circuit determines that this signal is a real ESD event of interest based upon a detecting algorithm and multistage filtering including the radiated ESD energy spectrum, pulse duration and threshold levels as discussed in details below in various embodiments of the invention.

SUMMARY

In one embodiment of the invention, there is provided an apparatus for electrostatic discharges (ESD) events monitoring incorporating an ESD event detector and a charged device model event simulator (CDMES) unit. The detector includes: at least one antenna positioned in a first a process area; an ESD detector coupled to at least one antenna; said ESD detector wirelessly coupled to said CDMES unit during in-tool/in-process calibration; and said ESD detector calibrated for different discharge energies generated by said CDMES unit.

In yet another embodiment of the invention, a method for electrostatic discharges (ESD) events monitoring comprises incorporating and calibrating an electrostatic detector for different discharge energies (CDMES) in real technological processes and/or in-tool conditions, and performing selective detecting of ESD events based upon variable thresholds of discharge energies.

It is to be understood that both the foregoing general description and the following detailed description are exemplary and explanatory only and are not restrictive of the invention, as claimed.

The accompanying drawings, which are incorporated in and constitute a part of this specification, illustrate one (several) embodiment(s) of the invention and together with the description, serve to explain the principles of the invention.

BRIEF DESCRIPTION OF THE DRAWINGS

Non-limiting and non-exhaustive embodiments of the invention are described with reference to the following figures, wherein like reference numerals may refer to like parts throughout the various views unless otherwise specified.

DETAILED DESCRIPTION OF PREFERRED EMBODIMENTS

Figure 1A:
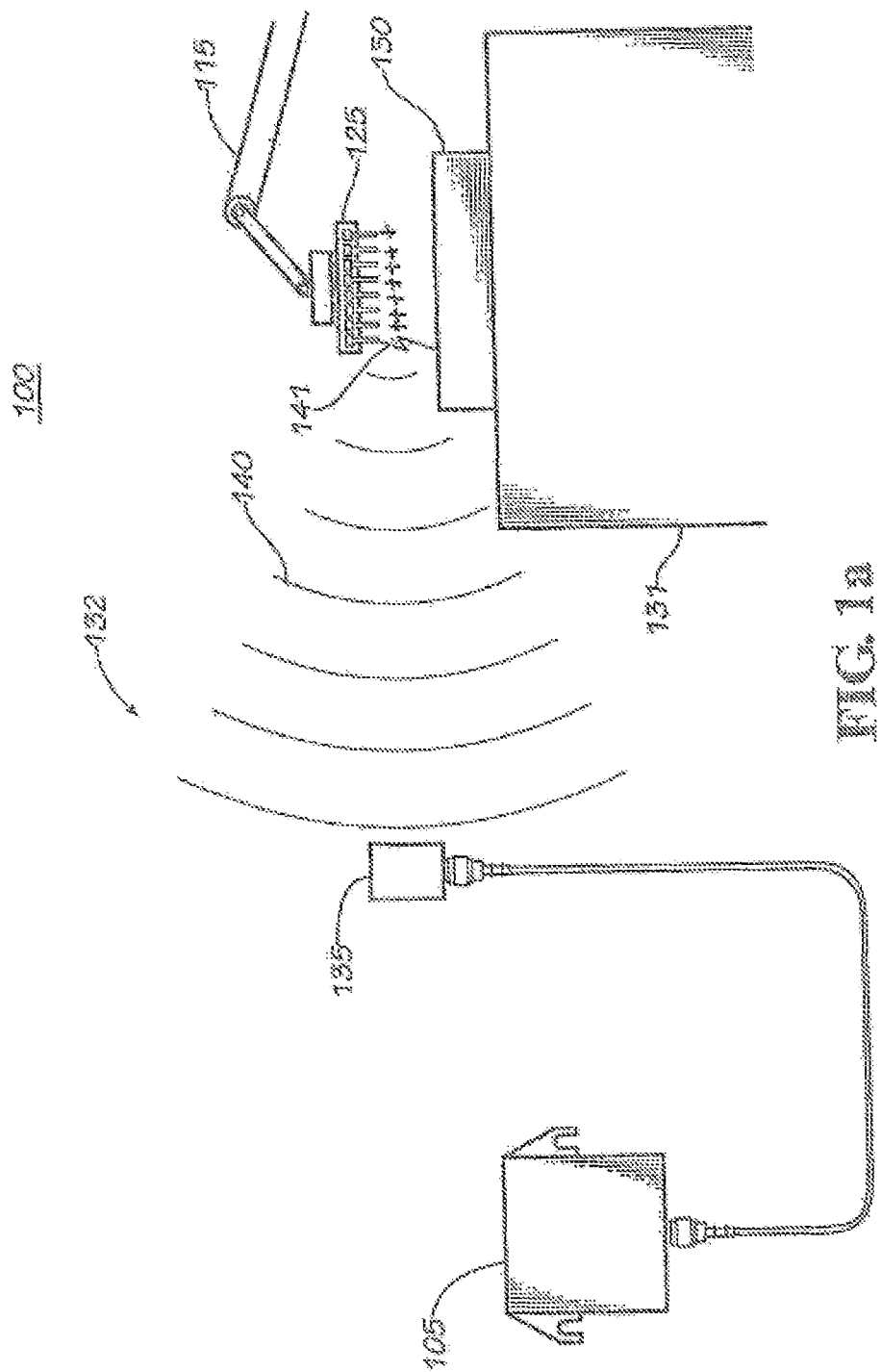
FIG. 1a is a diagram of a typical discharge model of a charged (e.g., IC) device CDM event in a tool or technological processing chamber.

In the description herein, numerous specific details are provided, such as examples of components, materials, parts, structures, and/or methods, to provide a thorough understanding of embodiments of the invention. One skilled in the relevant art will recognize, however, that an embodiment of the invention can be practiced without one or more of the specific details, or with other apparatus, systems, methods, components, materials, parts, structures, and/or the like. In other instances, well-known components, materials, parts, structures, methods, or operations are not shown or described in detail to avoid obscuring aspects of embodiments of the invention. Additionally, the figures are representative in nature and their shapes are not intended to illustrate the precise shape or precise size of any element and are not intended to limit the scope of the invention.

Those skilled in the art will understand that when an element or part in the drawings is referred to as being "on" (or "connected" to or "coupled" to or "attached" to) another element, it can be directly on (or directly attached to) the other element or intervening elements may also be present. Furthermore, relative terms such as "inner", "outer", "upper", "above", "lower", "beneath", "below", "downward", "upward", "toward", and "away from" and similar terms, may be used herein to describe a relationship of one element relative to another element. It is understood that these terms are intended to encompass different orientations of the device in addition to the orientation depicted in the figures.

Although the terms first, second, and the like may be used herein to describe various elements, components, parts, regions, layers, chambers, and/or sections, these elements, components, parts, regions, layers, chambers, and/or sections should not be limited by these terms. These terms are only used to distinguish one element, component, part, region, layer, chamber, or section from another element, component, part, region, layer, chamber, or section. Thus, a first element, component, part, region, layer, chamber, or section discussed below could be termed a second element, component, part, region, layer, chamber, or section without departing from the teachings of the present invention.

Additionally, the elements illustrated in the figures are schematic in nature and their shapes are not intended to illustrate the precise shape of an element of a device and are not intended to limit the scope of the invention. Furthermore, based on the discussion of the embodiments of the invention as presented herein, those skilled in the art will realize that the positions and/or configurations of the components in the drawings can be varied in different sizes, different shapes, different positions, and/or different configurations. Therefore, various components shown in the drawings can be placed in other positions that differ from the configuration as shown in the drawings. The components in the drawings are illustrated in non-limiting example positions for purposes of explaining the functionalities of the embodiments of the invention, and these components in the drawings can be configured into other example positions.

The charged device model (CDM) testing and ESD event monitoring system (or apparatus), in accordance with an embodiment of the invention, were developed under consideration that, in general, processing chambers (e.g., semiconductor tools) are essentially echoic chambers with a relatively high electrical noise level due to a surrounding metal enclosure. Example elements of noise sources may be electronics, brush DC (Direct Current) motors, robotic actuators, switches, electrical systems, and/or the like.

In practical terms, each tool has unique characteristics (e.g., EMI (electromagnetic interference) landscape) in reflecting internal electromagnetic field radiation caused by electrostatic discharge events. The typical scenario for CDM events is that a charged IC device is discharged when it contacts a tool or process element of a different electric potential. This discharge across a dielectric gap (typically air) causes the dipole formed by the differing electrical potentials to collapse or a capacitor formed between charged IC and tool parts to collapse. An embodiment of the invention also provides an ESD event monitor, which is also referred herein as a "MiniPulse" detector (comprising a MiniPulse/MicroESD antenna and a MiniPulse detector unit) or ESD monitor. The monitor is, for example, a low-cost event monitor for workstations, electronics production tools, processes, and/or mobile applications. The resulting radiated electromagnetic pulse waveform (radiated signal) is detected by, for example, the MiniPulse detector and an antenna that is communicatively coupled to the MiniPulse detector. If the detected field voltage level of this pulse waveform is above the threshold calibrated with the Charged Device Model Event Simulator (CDMES) equipment, then the MiniPulse detector registers a significant CDM/ESD event.

The CDM/ESD events are, for example, characterized by short (typically less than approximately 4 nano-seconds) duration changes in the electromagnetic field and generate, in the antenna, an induced voltage (current) rising signal with a high slew rate. Therefore, regarding in tool ESD monitoring, the detection system used should distinguish a CDM signal of interest from a general tool noise in an echoic chamber environment.

According to various embodiments of the invention, calibration methods for ESD detectors are provided. A suitable equipment such as, for example, a CDMES device known in the art, may be used to simulate CDM events, and a calibration method is then performed according to an embodiment of the invention. For example, in situ monitoring of CDM events is facilitated by simulating a group of spark gap discharges in the real tool at the point where IC devices contact conductive tool elements. The collapsing charged capacitor discharge simulates CDM events at a pre-selected voltage/energy threshold value for a given IC device. When this procedure is completed, the tool can be said to be calibrated for IC (integrated circuit) CDM ESD event detection at the specified level.

The CDMES is configured in an example of one embodiment as a device with an open moving electrode in the discharge gap (or the device may be a mercury or RF relay, or high voltage RF relay such as, for example, a reed relay).

The CDM/ESD event simulated discharges generate signals that are intercepted and detected in the receiving antenna of the monitoring device (MiniPulse). The MiniPulse antenna (MicroESD antenna) is coupled to the MiniPulse (see FIG. 3a) and permits the MiniPulse to receive the waveforms due to an ESD event. The MiniPulse can be calibrated in situ by varying the CDMES discharge voltage/energy and/or the position of the MiniPulse antenna with respect to the expected CDM event source.

Therefore, the CDMES is a charged device simulator that creates a known energy radiated spark that is similar to a discharge occurrence when a charged device (like IC) is approaching or contacting a socket. This CDMES is used to calibrate the MiniPulse. A DC power supply is coupled to the CDMES, and any or various suitable power supply voltage values (e.g., 100V, 200V, 500V, or other values) are driven into the CDMES. When an ESD event is simulated, the antenna detects the waveform from the CDMES-created discharge, and the MiniPulse captures and processes the waveform detected by the antenna. An example of a waveform due to a CDMES-created discharge is observed in the oscilloscope as shown, for example, in FIG. 1b, as also further discussed below.

Based upon a calibration plot and known product CDM failure thresholds, the ESD threshold voltage level may be set up (or otherwise configured) for the MiniPulse detector. The output alarm signal from the MiniPulse will be generated and may be sent to a tool control system if CDM events exceed the threshold level for real IC discharge events in the tool.

The CDM Event Simulator has been designed to allow ESD monitors (detectors) to be calibrated inside the tools and processes where CDM events occur. This simulation device allows the creation of calibrated CDM events of different voltage amplitudes to be produced at the point where production devices are most vulnerable and where ESD monitoring sensors are located. This approach allows the highest level of handling safety for sensitive devices.

CDMES (Section):

CDMES version/example: "Collapsing capacitor" with a mechanical gap to generate a CDM Event (see FIGS. 2a and 2b).

This version or embodiment of the CDM Event Simulator (CDMES) uses a mechanical gap to generate a controlled discharge event and simulate the electrostatic discharge which occurs between a charged IC and either an object (target) at a different electrical potential or a ground reference. This mechanical gap is between two small plates forming a collapsing capacitor, wherein the collapsing capacitor comprises one charged plate with a contact point and one ground plate with second contact point.

Specifically, this embodiment models the Charged Device Model (CDM) discharge type which is characterized by a fast single-peak pulse waveform of transferred current between the device and ground. The CDMES power circuit incorporates high resistance (up to, for example, approximately 100 mega Ohms or more) so that the voltage across the mechanical gap is high (approximately 25V-3000V range) and the applied current is less than approximately 10 micro amperes across this range.

Figure 1B:
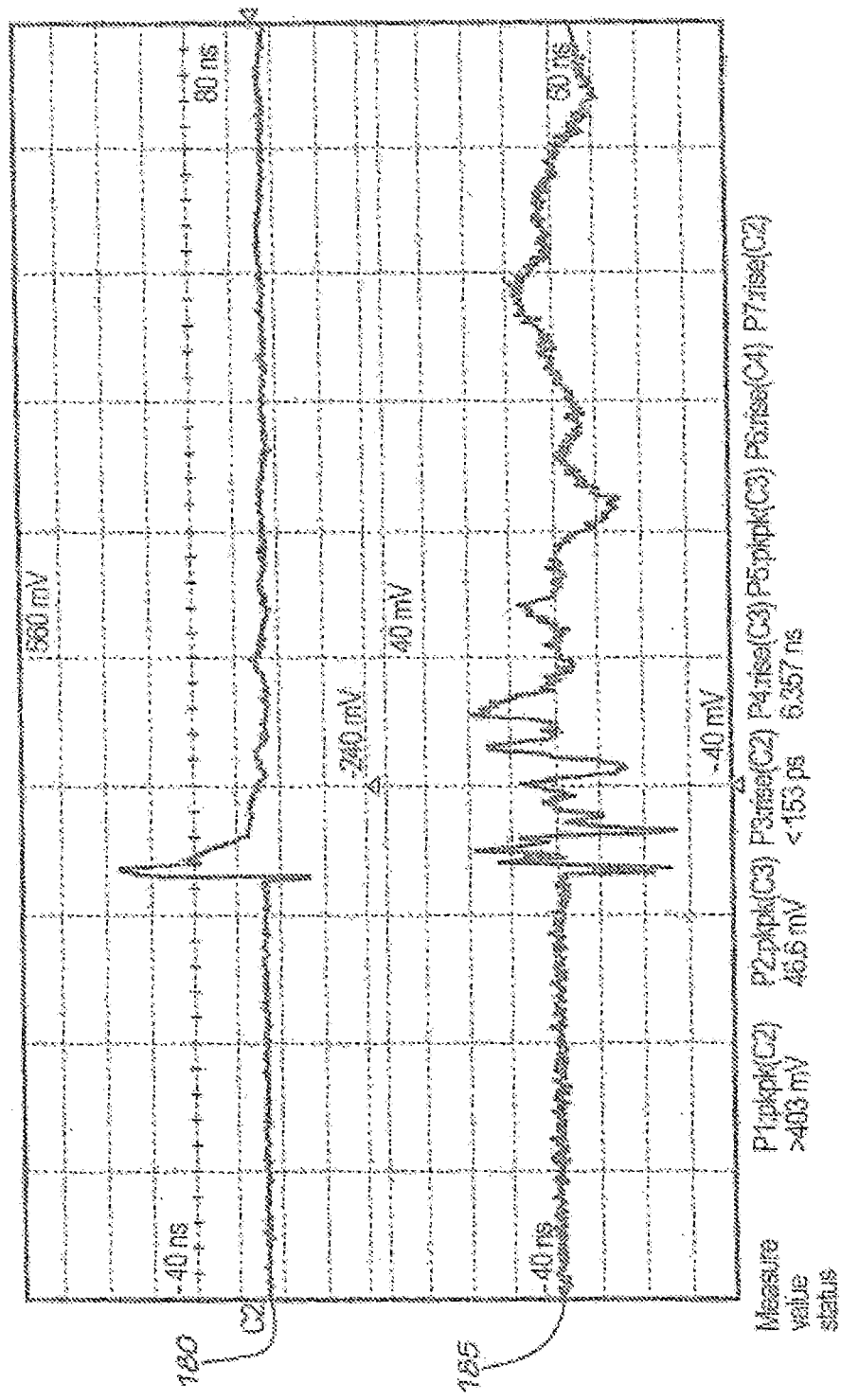
FIG. 1b is a screen shot of a typical example voltage/current waveform of a CDM electrostatic event where a discharge takes place in the form of a spark between two conductive parts moving to contact.

An electrostatic discharge would occur for an arbitrary charged contact and typical ground contact (see FIGS. 1a and 1b). Therefore, when the CDMES 206 (FIG. 2a) is charged with a DC power supply voltage 205, the CDMES 206 will simulate an ESD event.

The conducted CDM pulse as reproduced on the oscilloscope is a graph of the current pulse waveform and corresponds to the classical CDM waveform referenced in standards documents (IEC 61000-4-2, ISO10605, JESD22-C101E). The produced waveform also corresponds to the input CDM pulse waveform which formal device test machines (see standards referenced above as examples) use to evaluate device ESD susceptibility. That is why this type of collapsing capacitor CDMES presents a convenient calibration instrument for use in tools and other processing areas.

Figure 2A:
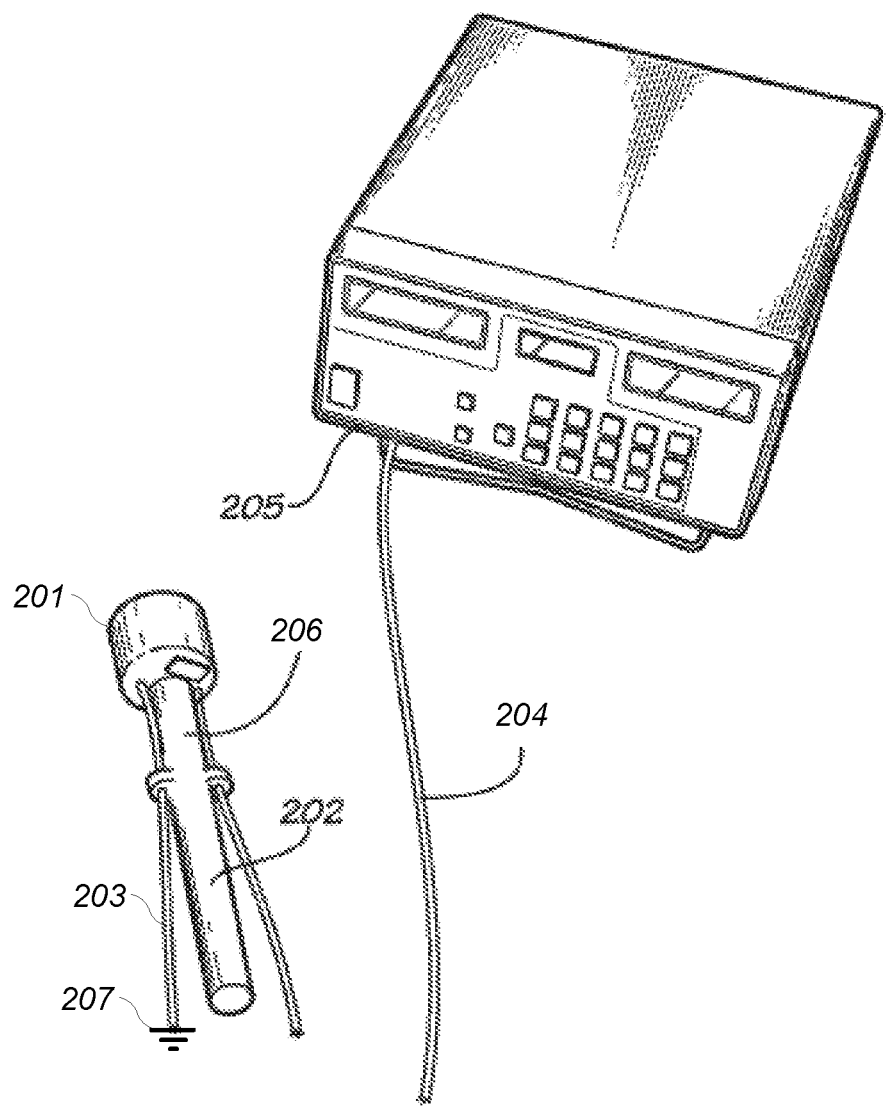
FIG. 2a is a diagram of a general view of a charged device model event simulator (CDMES) with an external HVPS (high voltage power supply), in accordance with an embodiment of the invention.

FIG. 2a is a diagram of a general view of a system 200 comprising a charged device model event simulator (CDMES) 206 with an external HVPS (high voltage power supply) 205, in accordance with an embodiment of the invention. The CDMES 206 has a discharge head 201, and the discharge head 201 is mounted to a handle and triggering mechanism 202, in accordance with an embodiment of the invention. The EM (electromagnetic) transparent discharge head enclosure (e.g., made from Delrin) accommodates the collapsing capacitor. This collapsing capacitor is electrically coupled to an external DC HVPS (high voltage power supply) 205. The high voltage power cable 204 connects power to the discharge head 201. Cable 203 connects discharge head 201 with common ground 207.

Figure 2B:
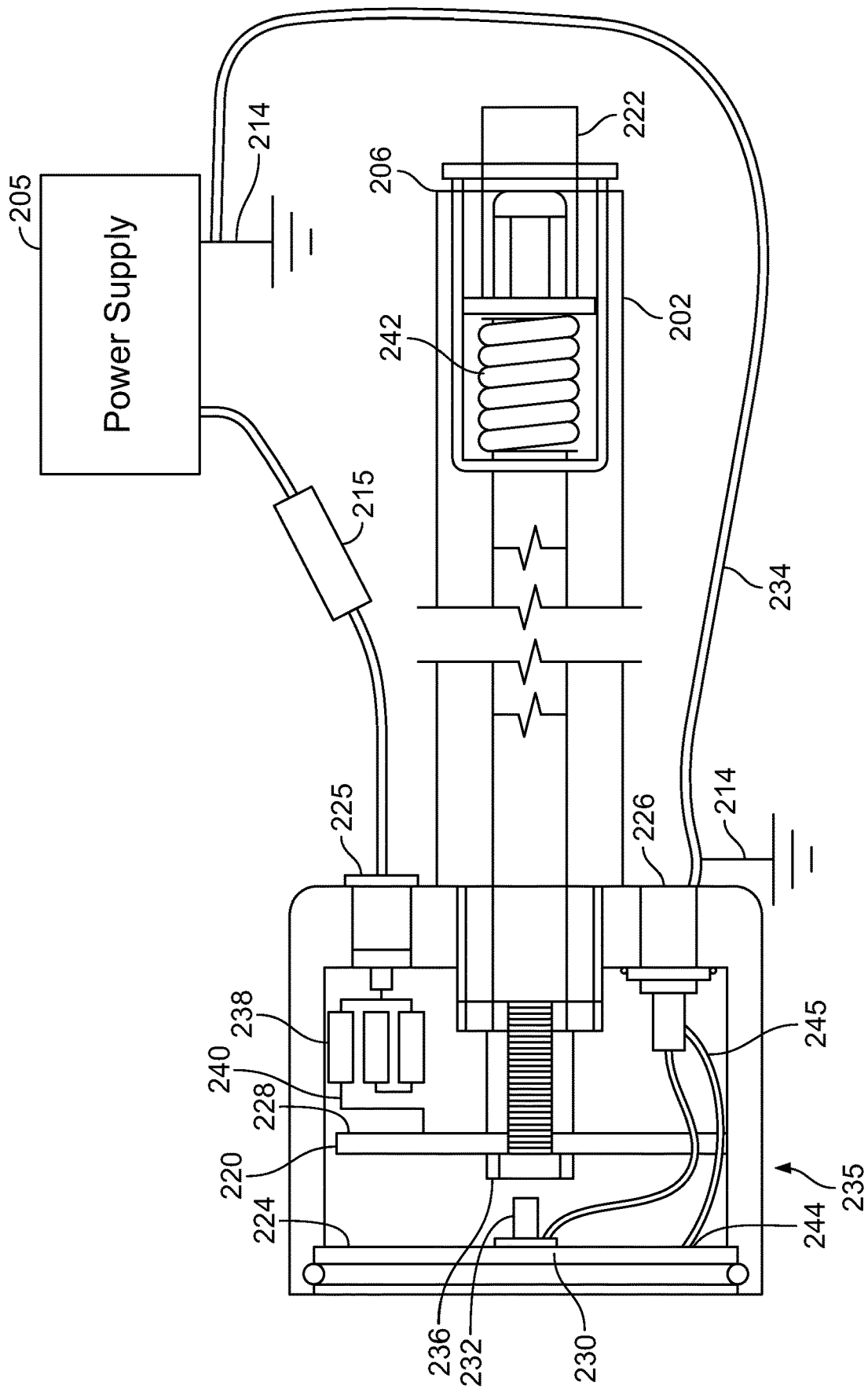
FIG. 2b is a diagram of a CDMES with a collapsing capacitor, in accordance with an embodiment of the invention.

FIG. 2b is a diagram of a CDMES 206 with a collapsing capacitor, in accordance with an embodiment of the invention. The mechanical structure of a CDMES 206 with the "collapsing" capacitor comprises the following features.

The basic CDMES 206 uses a capacitor, created/arranged by a conductive plate on both of two PCBs (printed circuit boards) in close proximity to each other. The charged PCB 220 (in CDMES 206) is movable by pressing the test button 222 on the handle 202 end, while the other PCB 224 (in CDMES 206) is fixed.

The whole assembly (internal to the CDMES 206) is contained within, for example, a Delrin housing to which are mounted the power connector 225, ground connector 226 and the handle 202. The voltage plate 228 of the movable charged PCB 220 is charged to the desired test voltage through a high value resistor 215.

The fixed plate 230 (of fixed PCB 224) contains a grounded plane surrounding an isolated "pogo pin" contact 232 (or another suitable type of contact 232). This contact 232 is connected (via ground connector 226) through a cable 234 to ground 214.

When the CDMES button 222 is pressed, the charged board 220 is physically moved toward the fixed board 224. Just before the PCBs contact, an ESD event will occur to the pogo pin contact 232, thereby discharging the capacitor 235 formed by the plates 228 and 230. Careful design eliminates contact bounce, ringing, etc., thereby leaving a clean ESD event which may be used to calibrate the "MiniPulse" or other ESD monitor. When the CDMES button 222 is released the movable PCB 220 returns to its relaxed position and is once again charged and ready for the next ESD event test.

An appropriate power supply 205 is used to generate the desired test voltage, from approximately 25 volts up to 4,000 volts. The test voltage, current limited by a resistor 215 of, for example, approximately 100 MΩ, is applied to the input connector 225 in order to power the board 220 and the electrode 236 (on the board 220). The current is further limited by an internal 30 MΩ resistor string 238 which is connected to the movable Charge Plate PCB 220 plane 228 through a flexible wire 240. Another suitable type of resistor 238 may be used to limit the current to the PCB board 220.

This board 220 which is in close proximity (e.g., approximately 0.35") to the Target PCB 224 creates a capacitor "C" 235 which becomes charged to the desired full test voltage. To generate a test pulse, the spring 242 loaded Test Button 222 is depressed, thereby causing the Charge Plate PCB 220 to move toward the ground plane Target PCB 224. As the separation distance decreases, the Source Charge Electrode 236 on the board 220 approaches the Target Electrode 232 until an arc/spark discharge is generated. This arc/spark causes a radiated signal to be emitted and this radiated signal is used to calibrate the MiniPulse ESD monitor (e.g., detector 355 or ESD detector 355 in FIG. 3a).

During the process of calibrating the MiniPulse detector, the collapsing capacitor (C) 235 allows the user to simulate various supply voltage values (e.g., approximately 20V, 100V, 500V, or other values) that are discharged into the Target Electrode 232 on PCB 224. The user can also mechanically control the gap distance between the boards 220 and 224 by use of the button or actuator 222. The arcing will be dependent on the voltage applied to the board 220 and the gap distance at the time of the discharge.

Additionally, the pulse is available through the coaxial wire connection 226 with a shield ground connection 244. A coaxial wire 245 carries the pulse signal to the SMA output connector 226. When the Test Button 222 is released, the spring load 242 causes the PCB 220 to return to the original position of the PCB 220 and the capacitor 235 recharges, and the capacitor 235 will be ready to perform the next test. Any suitable mechanism (e.g., springs or other mechanisms) may be used for automatically returning the PCB 220 to the initial position of the PCB 220 away from the PCB 224 when the button 222 is released.

Typically, the enclosure in FIG. 2b is a dielectric wall(s) and this enclosure will preferably not provide real attenuation to the electromagnetic fields (waveforms) occurring therein. Additionally, the power supply 205 and CDMES discharge head (connector 226) must be tied to the same ground.

The collapsing capacitor 235 may have an effective capacitance of approximately 0.5 pF-2 pF or more depending on the desired discharge energy range.

If the second electrode 232 is grounded, as in the case shown in FIG. 2b, the discharge energy W is fully defined as follows:

$$W = C(V_1)^2/2$$

where C is the collapsing capacitor value, and $V_1$ is the voltage applied to the capacitor (before discharge). For example, if C=1 pF and the applied voltage is 100V, then the discharge energy will be $5 \times 10^{-9}$ J (Joules).

When the CDMES 206 activates, both electrodes of the capacitor C come to ground potential (the capacitor C is collapsed) and the electrical discharge of known energy W is generated.

Figure 3A:
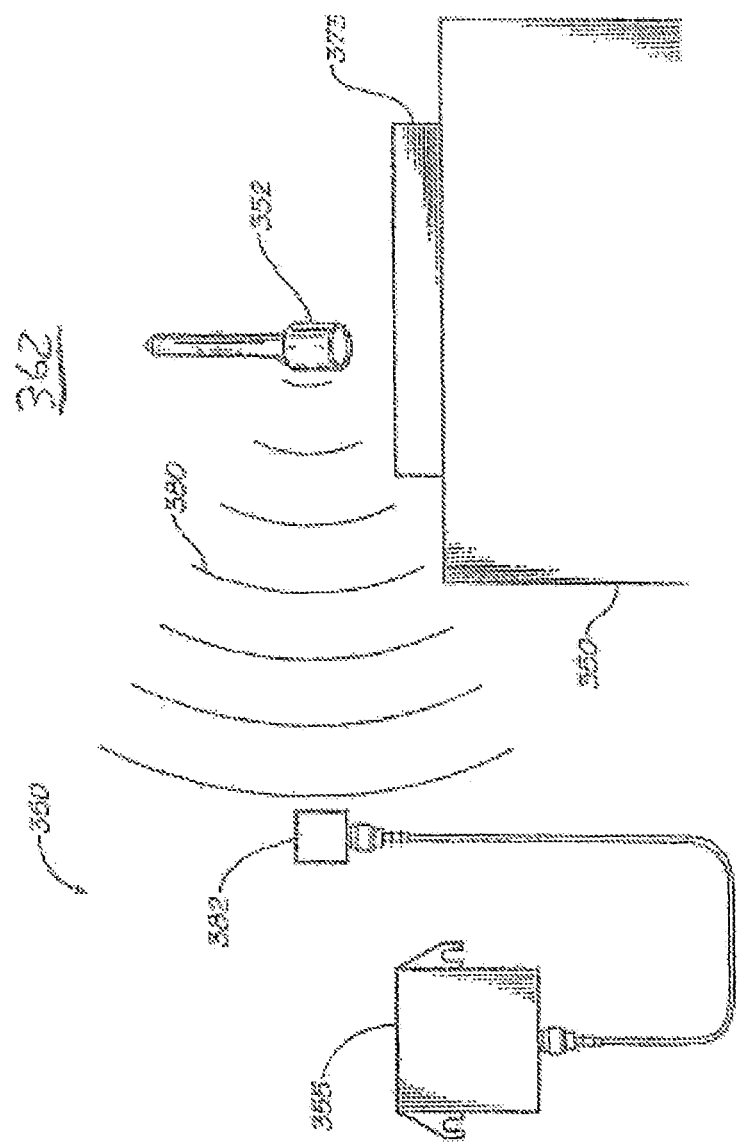
FIG. 3a is a diagram of a system (or apparatus) including a charged device model event simulator, and wherein the system is configured to also provide a calibration method for an ESD event detector in a real environment (processing area), in accordance with an embodiment of the invention.

FIG. 3a is a diagram of a system 350 (or apparatus 350) including a charged device model event simulator 352 (or CDMES unit 352), and wherein the system 350 is configured to also provide/illustrate a calibration method for an ESD event detector 355 (detector 355 and antenna 382 or ESD detector 355), in accordance with an embodiment of the invention. Therefore, FIG. 3a illustrates a depiction and an example of a mutual position of a CDMES and ESD detector during the calibration of an ESD Event Detector 355 coupled to the antenna 382. The ESD simulation performed by the CDMES 352, and a calibration method for the ESD event detector 355, may be done in a real tool or processing chamber 362 (in-situ). However, as mentioned above, embodiments of the CDMES 352 may also be used in an open work bench, any tabletop, a real environment, or any other suitable environment where a calibrated CDM event is created and detected for purposes of calibrating an ESD detector. More discussion on the ESD detector calibration in tool and processing is also discussed with reference to FIG. 3b. Additionally, the CDMES unit 352 may be embodied as the CDMES 206 in FIGS. 2a and/or 2b.

As similarly discussed with reference to FIGS. 2a and 2b, the CDMES 352 is coupled with (and operates with) the HVPS 205 (as shown, e.g., in FIGS. 2a and 2b). When the handle's trigger button 222 (see FIG. 2b) is pressed, the CDMES unit 352 uses the voltage from the HVPS 205 and an ESD event generating mechanism (e.g., the features of the CDMES 206 as shown in FIG. 2b) in order to produce an ESD discharge pulse event.

The discharge head (of CDMES 352) is charged by the preset calibration voltage from the HVPS 205 (FIG. 2a or 2b). The antenna 382 (coupled to the ESD detector 355) intercepts the radiation 380 (or electromagnetic waves 380) of the discharge event generated within the CDMES 352. In an embodiment of the invention, the antenna 382 is specifically designed to certain applications to be used with this product ("MicroESD" antenna) and will be discussed below in additional details. The antenna 382 (or MicroESD antenna 382) is configured to detect the different discharge energy levels in the radiation 380. As also mentioned above, the simulation of the ESD event, by use of the CDMES 352 and corresponding elements (e.g., HVPS 205 and ESD detector 355 and antenna 382), may be performed in the chamber 362 or may be performed outside of the chamber 362 (i.e., may be performed in an open work bench, any tabletop, a real environment, or any other suitable environment where a calibrated CDM is created and detected for purposes of calibrating an ESD detector 355).

The drawing of FIG. 3a shows radiation waves 380 in the direction of the propagating electrical field, as the antenna 382 is positioned normal/perpendicular to the radiating element (discharge head) of CDMES 352. Any signal will be largely due to reflections. If the CDMES head 352 were rotated approximate 90 degrees CCW (counterclockwise) the signal produced by antenna 382 would be significantly affected.

The CDMES 352 is generating a discharge at the point (as close as possible) where normal device handling occurs (e.g., at socket or sockets 373), thereby simulating a device CDM discharge event in-situ. The ESD detector 355 (MiniPulse 355) has a relay output to inform a tool control system of ESD events.

An antenna 382 (which is part of the ESD detector) is attached to the MiniPulse 355 input. The ESD trigger threshold energy level of the "MiniPulse" detector 355 is calibrated by an adjustment potentiometer to distinguish ESD events of interest.

The relay output of the ESD detector 355 may be used to monitor the MiniPulse Alarm status (of MiniPulse 355). The relay output is, for example, an open collector driver which is pulled to ground concurrently with the audible alarm sounding from the MiniPulse 355.

During the process of calibrating the MiniPulse detector 355 (FIG. 3a), various polarity and values of the supply voltage (e.g., approximately 20V, 100V, 500V, or other values) and the collapsing capacitor of CDMES 352 allow the user to simulate the desired ESD event energies/strength.

This apparatus and method of CDMES calibration of the novel ESD detector disclosed herein in an embodiment of the invention have a number of possible benefits that may be one or more of the following.

1. An apparatus and method according to an embodiment of the invention provide an ability to calibrate ESD detectors/sensors in tools and processes in-situ mode where the ESD detectors/sensors will be used (rather than solely, in the ideal, in the abstract, and/or through laboratory calibration like the system disclosed by T. J. Maloney in U.S. Patent Application Publication No. 2007/0164747 or rough approximation routines).

2. The CDM simulation in-situ takes into account real production variable (for example, EMI noise, effects (like reflection of EMI field) on antenna signal, surrounding or nearby metal parts, close objects movements, and so on) conditions which affect ESD detector/monitoring calibration automatically.

3. An apparatus and method according to an embodiment of the invention allow statistical verification of ESD detector/sensor effectiveness through ease of a high repetition rate of discharge event simulation.

4. An apparatus and method according to an embodiment of the invention allow device handling tools to be calibrated for CDM discharge events during the tool tests, comparisons, and development process.

5. An apparatus and method according to an embodiment of the invention allow ESD detector periodic calibration in place, thereby removing the necessity of removing detectors from the tool or process for laboratory calibration.

Additional possible advantages of this version of the pair/tandem CDMES-ESD event detector ("MiniPulse") include one or more of the following in one or more embodiments of the invention:

1. A smaller discharge/spark generation head allows use of this instrumentation/embodiment in constrained tool spaces.

2. The CDM simulated events have less variation in discharge energy (and spark current) due to the elimination of the manual trigger interface (i.e., triggering is done with a discrete timed switch in one embodiment of the invention).

ESD Event Detector Section:

Many applications in semiconductor, disk drive, FPD (Flat Panel Display), automated IC handling, and a host of other manufacturing processes operate with ESD sensitive products in locations which are difficult to monitor/control directly. In addition, many of these environments by their nature are saturated with EMI noise sources ranging from HVDC supplies, electrical motors, and actuators to broadband communication (RF) units. Detecting ESD events at specific points related to product handling can be challenging.

The main features of this embodiment of the detector/monitor (i.e., the novel ESD events detector 355) are at least the following:

Controlling ESD detection by a pulse slew rate and duration in the nanosecond range: The "MiniPulse" detector 355 (FIG. 3a) is able to discriminate between different pulse event types. This allows the detector 355 to determine and select valid ESD-type events from other EMI (electromagnetic interference or emission) pulse packet signals (e.g., signal discharges from motors, switching devices, cell phones, TV (television), WiFi, environmental noises, etc.).

Therefore, the "MiniPulse" detector 355 (see FIG. 3a) determines if an ESD pulse event fits within a selected pulse event threshold so that the "MiniPulse" detector 355 can determine if that ESD pulse event falls within the CDM charged device model instead of the machine model and human model. As known to those skilled in the art, ESD events in the charged device model (CDM) and the human body model (HBM) will differ in resistance factors, capacitance factors, and signatures. Although an embodiment of the MiniPulse detector 355 does not actually indicate the difference between CDM and HBM type ESD events, the MiniPulse detector 355 decides trigger validity based upon a signal amplitude (related to discharge energy) over the trigger threshold and whether the pulse event fits within the time buffer (i.e., qualifying as a pulse).

Adjustable discharge energy Threshold Control: Due to electromagnetic field attenuation over distance, many wider-area ESD events can be filtered out by adjusting the sensitivity threshold voltage to match local event amplitudes (e.g., thresholds of approximately 1 volt, 100 volts, 500 volts, or other values) so that the detector 355 compares the voltage levels of local event amplitudes with a sensitivity threshold voltage, or maybe present a threshold energy density in Joules with a range of approximately 0.002 W/m2 to 663 W/m2 so that the detector 355 compares the energy levels of local event amplitudes with a threshold energy level.

A selective ESD detection method is provided in an embodiment of the invention: ESD events produce electromagnetic pulses. This pulse is formally described as an electromagnetic radiation flux density which radiates outward spherically from the source, with radiated energy decreasing as the wave progresses away from the source. The MiniPulse 355 (detector 355) samples this expanding field through interaction with an antenna 382 through inductive field coupling. The energy of the expanding electric field couples to the antenna 382, thereby producing a signal on the antenna and cable. The MiniPulse detector unit 355 demodulates the incoming signal on the cable, thereby decomposing the various frequencies into their power components. The MiniPulse 355 measures the combined power of the radiated pulse transient to determine if the measured combined power (i.e., energy level of the radiated pulse transient) is greater than the detection threshold set (i.e., set threshold for detection). If the energy level is below the set threshold for detection, the event is ignored. In addition, the MiniPulse detector 355 also samples the incoming signal for pulse duration using a comparator circuit (see comparator 505 in FIG. 5 and comparator 605 in FIG. 6) to determine if the pulse qualifies as a likely ESD event. If the pulse duration is within the time interval boundaries typical for CDM and HBM ESD events, the pulse triggers the detector 355. This method of selective detection is different from standard time-domain (versus frequency domain) signal analysis. The MiniPulse 355 works like a spectrum analyzer which extracts the energy of the ESD event signal. The main advantage of this approach is in significant economy of detection hardware. The radiating pulse power across the signal frequencies gives a very good first order approximation of the signal power, thereby enabling a comparison to be made between different ESD event energy levels.

The "MiniPulse" energy threshold control sensitivity allows fine tuning down to very small signal acquisition areas (ESD source/target within a range of approximately 0.005 m-2 m of antenna placement). This is an important aspect of limiting detected ESD events to only those of critical importance and/or those of interest to the user.

Figure 4A:
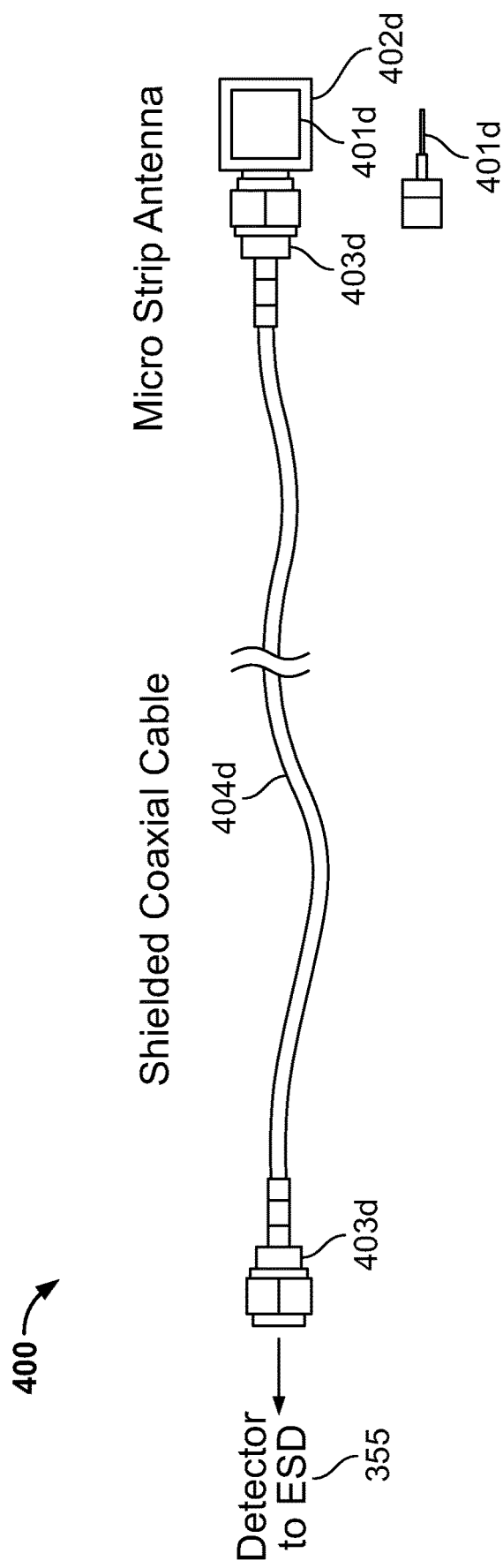
FIG. 4a is a diagram illustrating a Micro strip ESD antenna assembly, in accordance with an embodiment of the invention.

The antenna configuration in an embodiment of the invention is specifically designed and engineered as an ESD antenna 382 (see FIGS. 3a and 4a). The antenna 382 can be embodied as an antenna assembly 400 of FIGS. 4a, 4b, and 4c and will be discussed below in additional details.

Figure 3B:
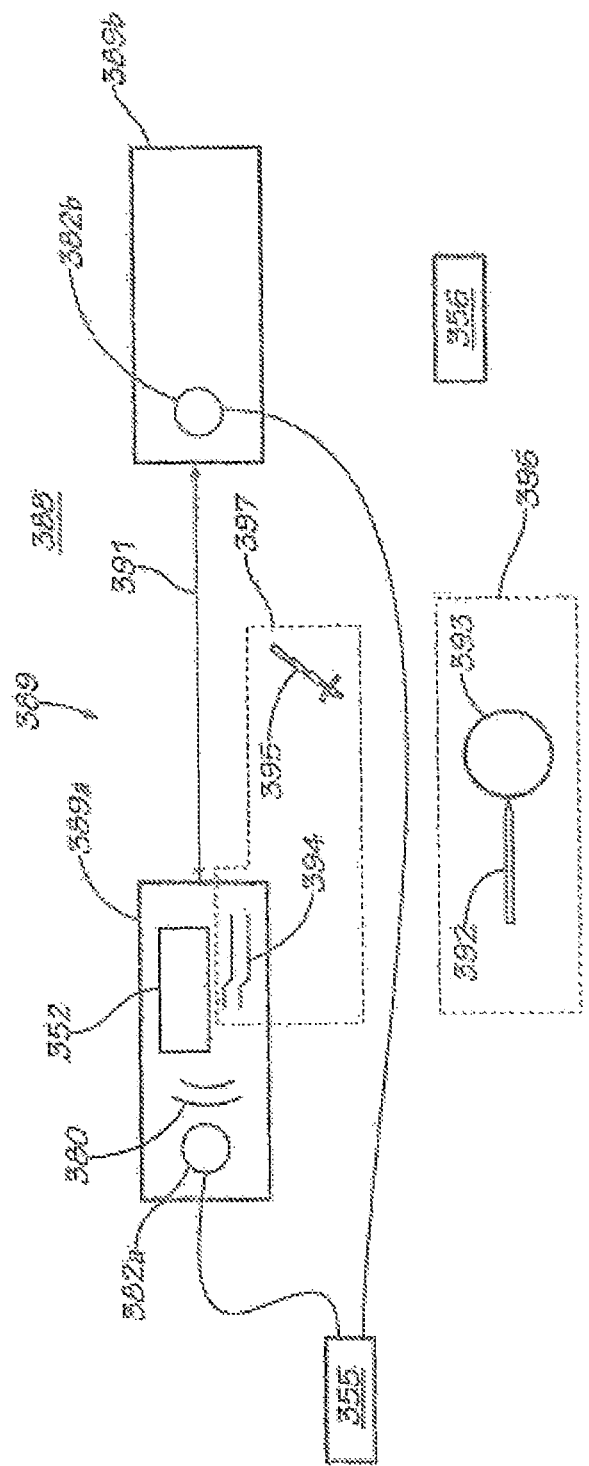
FIG. 3b is a diagram of a system (or apparatus), in accordance with another embodiment of the invention. The diagram shows variants of processing areas (in-tool and out of tool processing areas) with an ESD detector having two antennas in different processing areas.
Figure 3C:
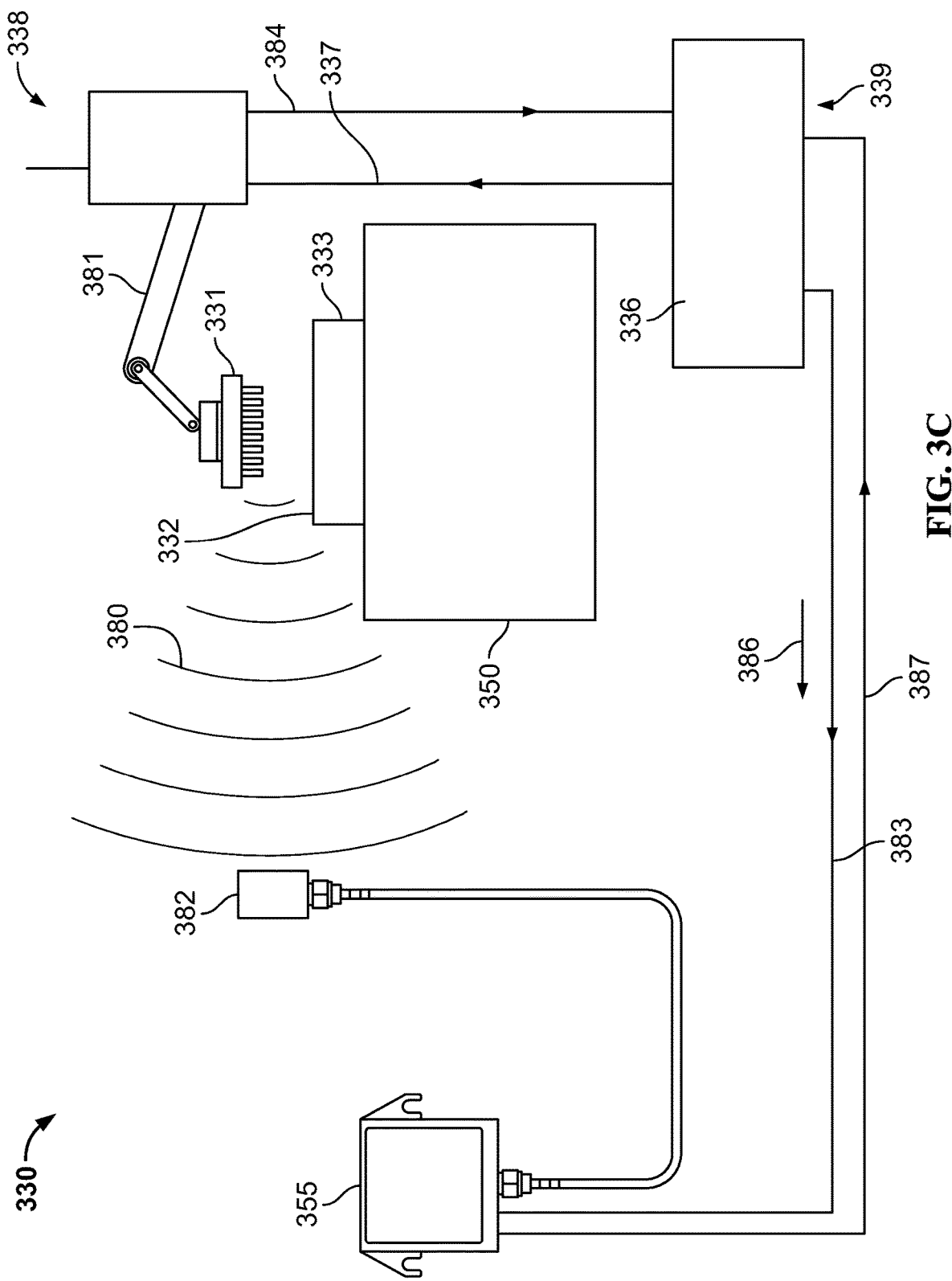
FIG. 3c is a diagram of a system (or apparatus), in accordance with another embodiment of the invention. The diagram shows an example of an interaction of an ESD detector with an in-tool controlling system.

Method for On-Demand/In-Tool ESD Signal Processing (see, FIGS. 3c and 3d):

FIG. 3c is a diagram of a system (or apparatus) 330, in accordance with another embodiment of the invention. The diagram shows an example of an interaction of an ESD detector 355 with an in-tool controlling system.

The MiniPulse detector 355 has a controlled duty cycle feature which allows On-demand signal processing to aid/enhance in ESD signal separation from general noise (for example, in the form of non-ESD electromagnetic (EM) pulses). This signal filtering method is available for both the standalone and Novx monitor versions (when ESD detector 355 is combined with another sensor(s)). This signal filtering method is in addition to antenna and other filter features of this detector 355 as described herein.

Example Embodiment:

The MiniPulse ESD detector 355 implements a standby mode which allows instantaneous activation and deactivation of signal acquisition. This standby mode feature allows processing tools to control ESD signal capture to the highest reputability of ESD detection.

Based upon actual tests, the repeatability estimate for this method ranges between approximately 90%-100% probabilities. In controlled manufacturing environments, ambient pulse noise occurrence is typically held to a minimum, with pulse noise shots/spikes largely originating from nearby tools and processes.

A method, in an embodiment of the invention, requires the use of the control native inputs to the "MiniPulse" detector 355 (ESD detector 355) by the host tool or process. Modern processing tools have control interfaces which track product movement and process functions. The "MiniPulse" detector acquisition control method allows the tool to signal specific processing windows (e.g., process windows 1 and 2 in FIG. 3d) where an ESD signature detection is desired. With process windowing, randomly occurring background pulse EM signals do not register to the tool as possible ESD events.

The electronic part of an ESD Detector device (detector 355) is controlled by the tool to activate only during the process window when an actual device is being handled or tested. As an example, when the tool processes an individual device, the tool signals the ESD detector 355 to switch to active mode. When the processing window is closed (e.g., no device is being handled/tested), then the tool signals the detector 355 to return to standby mode. During the active processing window, the detector 355 will signal the tool if any ESD events of interest occur.

When the processing window is closed and the detector 355 is returned to standby status, no ESD or other signals will be reported by the detector 355 to the tool.

In FIG. 3c, the system 330 includes the tool which is processing an individual device 331 in a tool processing area 330. The MiniPulse ESD detector 355 (detector 355) intercepts the electromagnetic waves 380, and the Robot Placement Effector 381 (or another suitable type of robotic arm 381) places a charged device 331 into a test socket 333. The test socket 333 is typically placed on a suitable test bed 350, base 350, or another suitable platform 350. As the charged device 331 approaches the test socket 333, a discharge (ESD) occurs and the antenna 382 (coupled to the MiniPulse Detector 355) intercepts the waves 380 of the discharge event. In this example, the ESD event is a discharge 332 that takes place in the form of a spark between two parts (device 331 and test socket 333) that are both characterized by different voltage potentials.

Figure 3D:
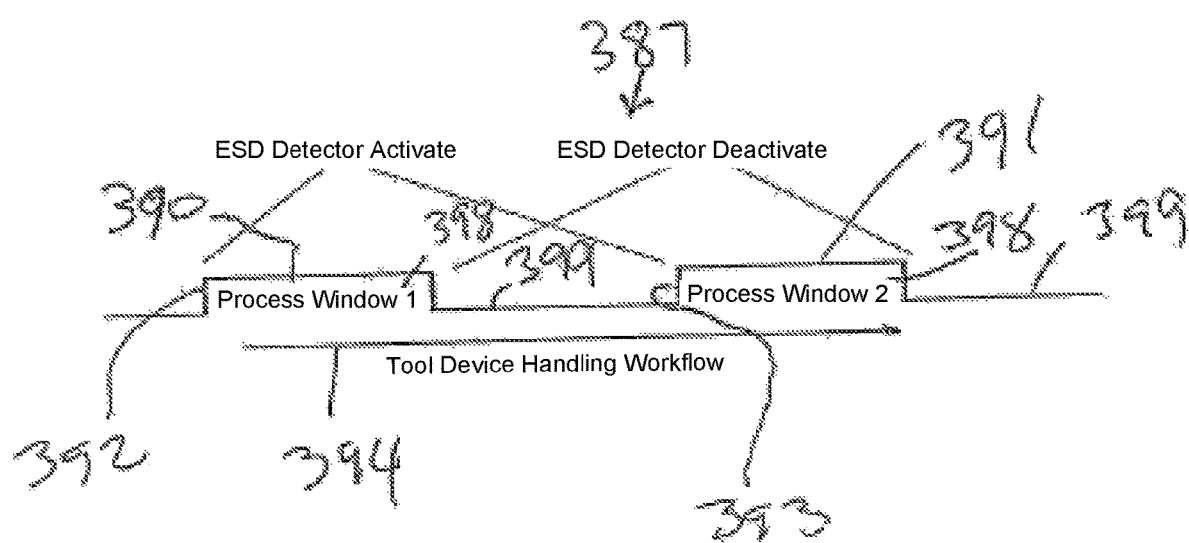
FIG. 3d is a diagram of a tool device handling workflow, in accordance with an embodiment of the invention.

The tool controller 336 (of tool 339) will signal (via control signal 337) the robot controller 338 to process the device 331 thereby activating tool process window 1 (390) (see FIG. 3*d*).

The device 331 is moved to the tool test socket 333 for example testing. The tool controller 336 also activates (via control signal 383) the detector 355 to report ESD events of interest related to device processing. The detector 355 reports any ESD events which occur when the device 331 contacts the socket 332. When this process is finished, the tool controller 336 closes process window 1 (390) and signals the detector 355 to return to a standby mode. Depending upon the tool process throughput, the tool 339 will continue to process windows as devices are handled.

As an example, when the robot controller 338 has finished processing a device 331, the robot controller will send control signal 384 to the tool controller 336 that the process window 1 is to be closed and the tool controller 336 will then close the process window 1. The tool controller 336 then sends a control signal 386 to the detector 355 so that the detector 355 has information that the process window 1 is now closed. This control signal 386 will deactivate the detector 355 so that the detector 355 returns to the standby mode, while the control signal 383 will activate the detector 355 so that the detector 355 can measure, compare, and record the waves 380 which may be ESD events.

In an embodiment of the invention, the control signal 383 may be represented by rising edges of process windows such as, for example rising edges 392 and 393 of process window 1 (390) and process window 2 (391), respectively, in the tool device handling window 394, as shown in FIG. 3*d* which illustrates a diagram of a tool device handling workflow 387. The handling window 394 may have at least one process window and the number of process windows in the handling window 394 may vary.

Alternatively, the control signal 383 (FIG. 3*c*) may be pulses 398 and the control signal 386 may be non-pulse intervals 399 between the pulses 398 in the handling window 394.

FIG. 3*b* is a diagram of a system (or apparatus) 388, in accordance with another embodiment of the invention. The system 388 is shown in a top plan view for purposes of clarity of discussion. As similarly discussed previously with regard to the system 350 in FIG. 3*a*, the system 388 is configured for electrostatic discharges (ESD) events monitoring and may incorporates a charged device model event simulator (CDMES) unit 352.

In an embodiment of the invention, the system 388 includes at least one antenna 382*a* that is positioned in a process area 389*a*, and an ESD detector 355 coupled to the antenna 382*a*. Since the antenna 382*a* is configured to receive the event signal 380 radiating from a CDMES unit 352, the antenna 382*a* is inductively coupled to the CDMES unit 352. The ESD detector 355 is calibrated for different discharge energies generated by the CDMES unit 352.

An ESD monitored process area would typically comprises an area bounded by a distance of up to approximately 2 m circumference from the antenna location.

In another embodiment of the invention, a process area (generally shown as area 389) includes a first process area 389*a* and a second process area 389*b*. The first antenna 382*a* is positioned in the first process area 382*a* and a second antenna 382*b* positioned in the second process area 389*b*.

In an embodiment of the invention, the first antenna 382*a* is coupled to the ESD detector 355 and the second antenna 382*b* is also coupled to ESD detector 355. In another embodiment of the invention, the second antenna 382*b* is coupled to another ESD detector 356 and is not coupled to the ESD detector 355.

Typically, the first process area 389*a* is separated from the second process area 389*b* by a distance 391, and the first antenna 382*a* and second antenna 382*b* form multi-channels. The distance 391 is adjustable.

In one embodiment, the first antenna 382*a* and second antenna 382*b* may be similar in an antenna response sensitivity. In another embodiment, the first antenna 382*a* and second antenna 382*b* are different in antenna response sensitivities.

The process areas 389 may vary in number from one or more process areas. For example, the process areas 389 can be presented as a cluster of tools. Therefore, more than two process areas may be included in the system 388.

At least one of the process areas 389 may include a socket 373 (FIG. 3*a*) that is configured to receive a semiconductor chip 331 or other device 331 (FIG. 3*a*), or may include a plurality of sockets 373 that are configured to receive a plurality of semiconductor chips or other devices.

At least one of the process areas 389 may include a tweezer 392 that is configured to receive a wafer 393 in another embodiment as best identified by reference 396. Of course, the tweezer 392 may be another type of wafer processing tool 392.

At least one of the process areas 389 (or wafer 393) may include conductive traces 394 that are accessible by a test probe 395 in an embodiment as best identified by reference 397. Any of the process areas 389 may be of another suitable type of area.

Figure 4B:
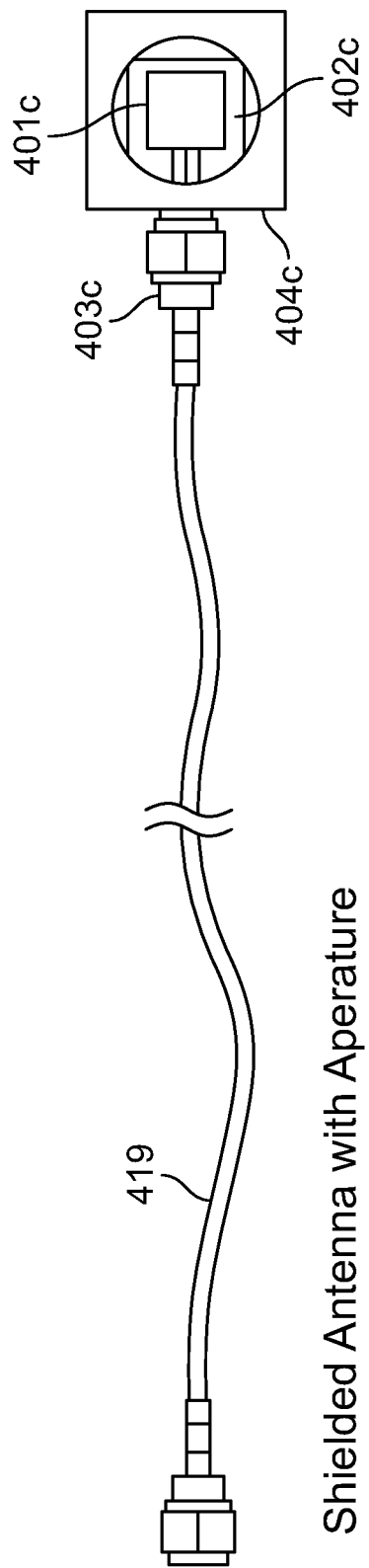
FIG. 4b is a diagram illustrating a shielded antenna with an aperture, in accordance with an embodiment of the invention.
Figure 4C:
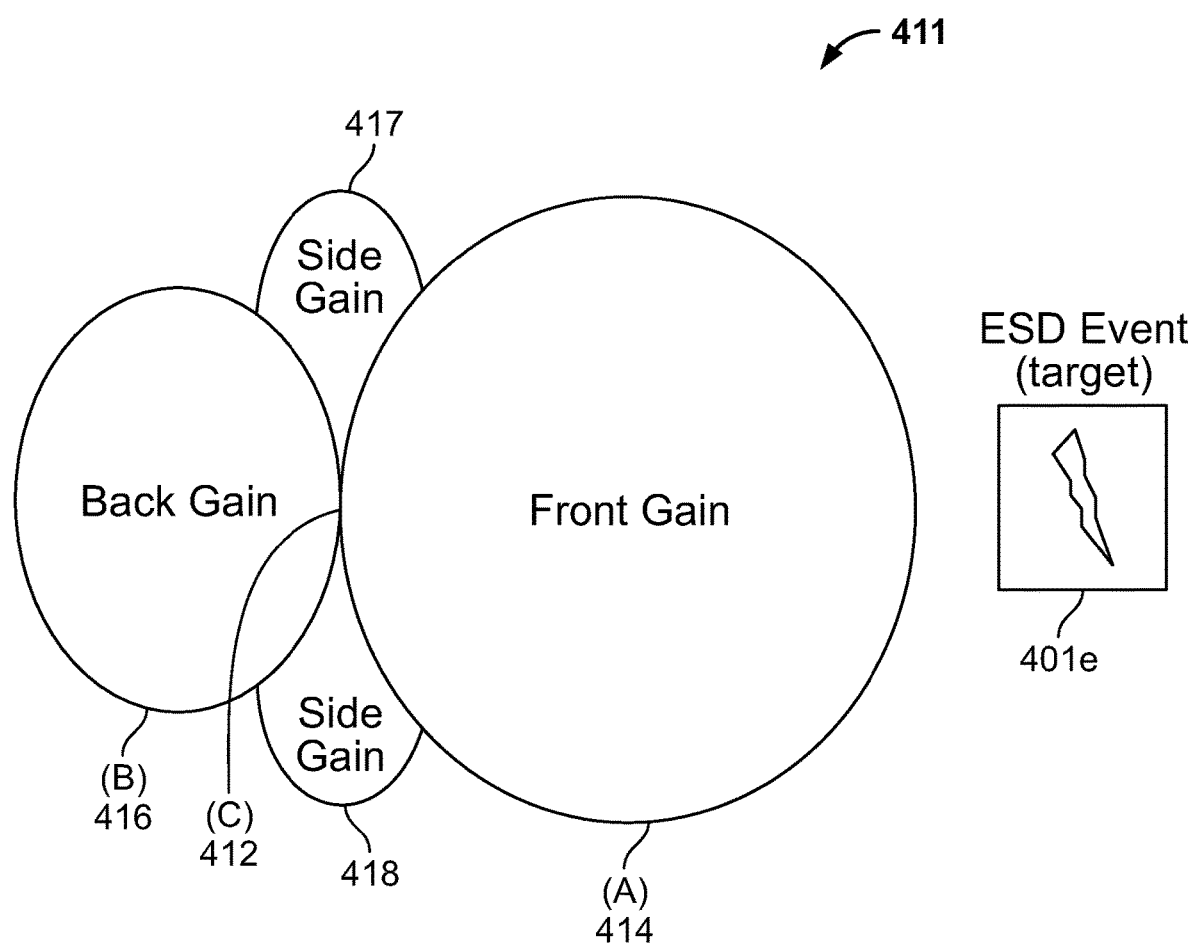
FIG. 4c is a diagram illustrating space gain characteristics of the micro strip antenna, in accordance with an embodiment of the invention.

Micro ESD Aperture Antenna(s):

Reference is now made to FIGS. 4*a*, 4*b*, and 4*c* in order to discuss additional details of various embodiments of an ESD antenna 382. The features described in FIGS. 4*a*, 4*b*, and/or 4*c* may be incorporated in the antenna 382 (FIG. 3*a*), antenna 382*a* (FIG. 3*b*), and/or antenna 382*b* (FIG. 3*b*). Therefore, the antenna discussed in FIGS. 4*a*, 4*b*, and 4*c* can be embodied as an antenna 382, antenna 382*a*, and/or antenna 382*b*.

FIG. 4*a* is a diagram illustrating a Micro strip ESD antenna assembly, in accordance with an embodiment of the invention. FIG. 4*b* is a diagram illustrating a shielded antenna with an aperture, in accordance with an embodiment of the invention. FIG. 4*c* is a diagram illustrating space gain characteristics of the micro strip antenna, in accordance with an embodiment of the invention.

Reference is first made to FIG. 4*a* which illustrates a micro strip antenna assembly 400. The elements of the micro strip antenna are a focal element 401*d*, backplane shield 402*d*, additional shield enclosure 404*c* (shown in FIG. 4*b*), connector(s) (feed point) 403*d*, and coaxial cable 404*d*. The antenna design characteristics are: a) focal element area of approximately 3 mm/square to 50 mm/square, b) antenna focal element shape (for example: rectangular or triangular), and c) antenna attenuating backplane (blocking shield) to limit signal acquisition to the front side (directional) antenna focal element. These characteristic elements define the antenna area (physical gain which is a ratio of antenna field energy to antenna voltage output) to accomplish the directional detection sensitivity level and physical range of coverage required for any specific application. Referring to FIG. 4*c*, an example antenna gain pattern 411 is shown in relationship to an ESD event target 401*e* (for example, a sensitive device placed in a socket for testing). In FIG. 4c, the antenna focal element is (C) 412, the front face of the antenna focal element has the highest directional gain (line (A) or front gain 414, for example, approximately 6.0 dBi), and is oriented toward the ESD event source 401e. The backplane side of the antenna has a lower gain (line (B) or back gain 416, for example, approximately 2.5 dBi or decibels relative to an isotropic antenna), which faces away from the ESD event source 401e. The antenna focal element has a side gain represented by the lines 417 and 418 between the lines represented by the front gain 414 and back gain 416. Another key factor in ESD event detection to a specific process point is the form and placement of the antenna 382 (FIG. 3a). The physical gain characteristics of the antenna 382 play a significant part in controlling ESD signal acquisition. The directional gain (see FIG. 4c) feature of the specifically designed antenna (connected to the "MiniPulse" detector 355) can be used to calibrate the detector 355 for given ESD events of interest to the user.

Antenna performance and noise insensitivity: The antenna 382 ("MicroESD" antenna 382 or micro antenna 382 or "MiniPulse" antenna 382) is specifically designed for electrostatic discharge (ESD) event detection. The engineered characteristics of the antenna 382 allow ESD radiated energy to be directionally detected for the discharge (event source) location while ignoring/suppressing other nearby events not of interest.

Variant of this antenna is designed specifically for ESD event detection. The antenna comprises a proprietary microstrip designed antenna surrounded by a metal casing 404c with an aperture 402c (see FIG. 4b). The antenna is designed to reject unwanted signals from surrounding areas in electromagnetically noisy tool processing areas. The aperture allows the internal antenna to acquire signals up to approximately 90 degree angle focused on a specific location or small area. Energy from any ESD event occurring in this focal area enters the aperture and couples to the micro strip antenna element.

Specific improvements of embodiments of the invention are provided over conventional technology and other available ESD event monitoring products.

The other type of antenna comprises a custom designed small printed circuit board (PCB) 401c, engineered to enhance directionality and the distance to be monitored. This antenna assembly (FIG. 4b) (comprising the PCB 401c) uses a ground plane on one side of the circuit board 401c and an active element on the other side of the circuit board 401c, thereby providing a back and side lobe rejection ratio of approximately 3 dB to 6 dB. The electrical link 419 (e.g., cable) is coupled to the circuit board 401c and removably coupled to an ESD detector 355 (FIG. 3a). The antenna also includes an integral RF connector 403c (FIG. 4b) which can be a general RF connector of any type.

Antennas used to detect ESD radiated pulse transients have traditionally been standard antennas with a very high gain. Whereas this makes detecting ESD events quite easy, it has made it virtually impossible to determine event origins. This weakness has made traditional antennas of little use in monitoring critical processes.

The "MicroESD" antenna 382 (e.g., the antenna 382 coupled to the MiniPulse detector 355 in FIG. 3a) was developed for the sole purpose of detecting ESD events in close proximity to their source. The MicroESD antenna 382 is embodied with various versions of designed microstrip antennas, as shown in the example antenna assembly 400 in FIG. 4a, which has an excellent ESD near-field radiant pulse reception, while rejecting other near and far-field pulse signatures due to engineered directional gain characteristics. This allows the MicroESD antennas to perform well where other antennas do not do so in identifying localized ESD events of interest.

In addition, the designed characteristics of this antenna allow a very wide signal discrimination range (approximately 10V-3000V) which is not the case with general antennas commonly used in ESD detection due to saturation effects. When used in conjunction with attenuators, very large ESD events can be captured effectively.

ESD events should preferably be monitored as close to their expected source as practical. Typical monitoring distances for the antenna installation range from, for example, approximately 1" (2.54 cm) and approximately 6" (15 cm), although other distances can be accommodated. The Micro ESD antenna 382 will purposefully become less efficient with greater distance from the source due to signal amplitude reduction and detection threshold settings.

Multiple antennas can be deployed as arrays of dipole structures in almost any configuration. For example, five antennas can be deployed to form an array. However, the array of dipole structures may have more than five antennas or less than five antennas.

MiniPulse Circuit Description:

ESD Event Detector (Electronic Part)

A block diagram of the details of the ESD Event Detector is now discussed in an embodiment of the invention. For example, the ESD event detector 355 of FIG. 3a comprises the system 500 (or circuit 500) of FIG. 5.

The antenna 501 generates a signal (RF or radio frequency signal) 550 delivered via an attached coaxial cable 551. The signal 550 is first processed by a digital attenuator 502. This processing limits the ESD signal and noise levels to keep the subsequent ladder network filter and demodulating log-amplifier from saturation. The attenuator 502 is programmable via the microprocessor 507, thus allowing the detector 355 to accommodate a wide variety of noise environments by attenuating the signal and noise up to, for example, approximately 15.5 dB.

The 6 order high-pass ladder network filter 502 blocks any DC signals and passes the ESD Event signals above 100 MHz (megahertz) typical of an ESD event to the log-amplifier 504.

A very fast (in micro seconds) six stage demodulating log amplifier 504 (e.g., Analog Devices AD8310) extracts multi-frequency amplification levels (dBm or decibel-milliwatts) from the detected ESD signal. This allows the MiniPulse detector 355 to discriminate signal levels for threshold control more accurately.

The output signal 552 of the log amplifier 504 is inverted so when a signal is input the log amplifier's output will be between approximately +2.5V (no signal) and approximately +1.0V or less (maximum signal). Therefore, embodiments of the invention provide a demodulating log amplifier 504 that operates in a measurement mode and generates an output signal 552 that is matched with a selected threshold for discriminating signal levels. This technology and method has not been used by other known ESD detectors.

Figure 5:
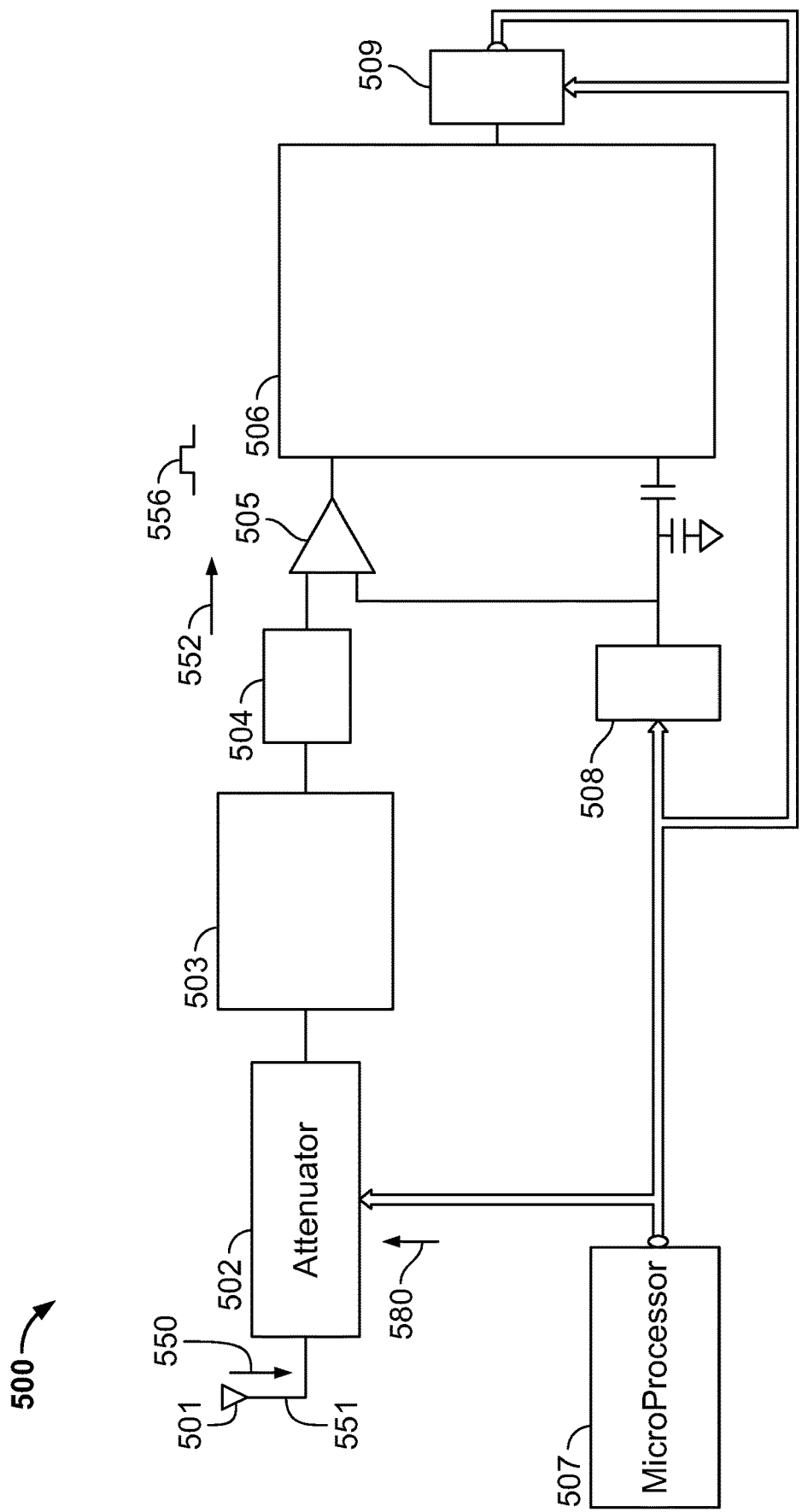
FIG. 5 is a block diagram of an ESD detector (MiniPulse), in accordance with an embodiment of the invention

The data 560 from the microprocessor 507 is used to set a threshold voltage level of a digital potentiometer 508, wherein that threshold voltage level is in the range of approximately +2.0V to +1V. An ultra-high speed comparator 505 (e.g., Analog Devices AD8561) compares the demodulating log amplifier 504 output signal with this threshold voltage. If the comparator 505 "sees" a true condition, a momentary pulse is passed to a pair of multi-vibrator one-shots 506. The one-shots 506 are configured to reject any pulse that is too short (<~10 nSec) or too long (>~500 nSec) meaning that the pulse is not an ESD event of interest. As shown in FIG. 5, the log amplifier 504 generates the output signal 552 after receiving an input signal from the filter/integrator 503 which will discussed further below with reference to FIG. 6.

True event pulses 556 are then counted (e.g., by a counter 509) and that count (from counter 509) is available to the Novx microprocessor (e.g., Atmel microcontroller) 507 for processing. Each time the count is read by the microprocessor 507, the count is then subsequently and automatically reset to zero by the microprocessor.

Figure 6:
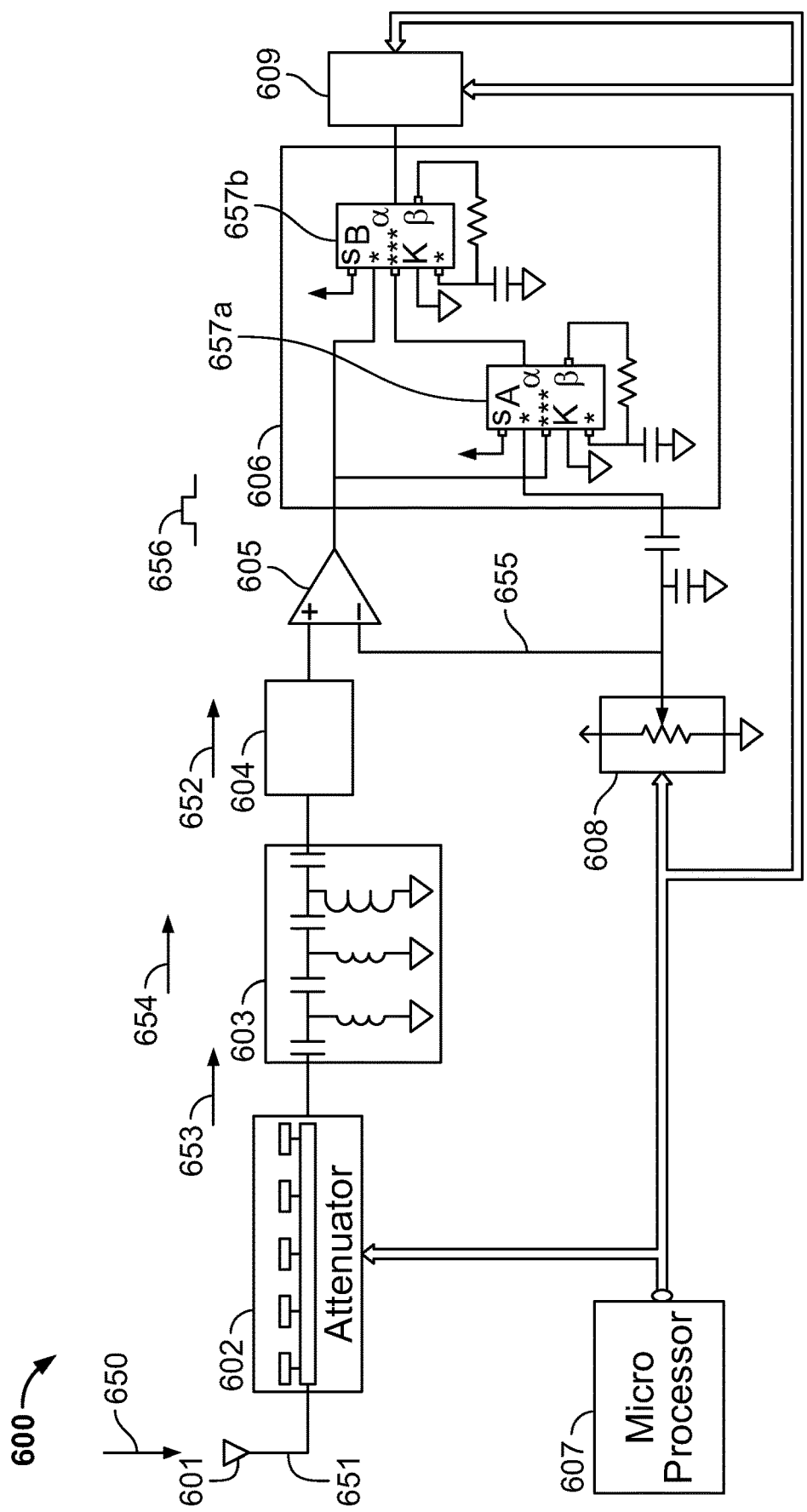
FIG. 6 is a simplified schematic diagram of the ESD monitor circuit of an ESD detector (as shown, for example, in FIG. 7), in accordance with an embodiment of the invention including an SNR (signal-to-noise ratio) filter.

Reference is now made to the block diagram 500 of FIG. 5 and the circuit diagram 600 of FIG. 6, in an embodiment of the invention. As noted above, FIG. 5 is a block diagram of an ESD detector 500 (MiniPulse 500), in accordance with an embodiment of the invention. FIG. 6 is a schematic diagram of the ESD monitor circuit 600, and this schematic diagram shows additional details of the block diagram 500 of the ESD event detector 355 of FIG. 5, in accordance with an embodiment of the invention. The MiniPulse 500 is also shown as (and described as) the ESD detector 355 in FIG. 3*a*.

The MiniPulse 500 uses a six-dimension algorithm by analyzing EMI events in the time domain and threshold discrimination to detect pulse electrostatic discharge of certain electromagnetic energy. Through the use of specific antenna configurations and antenna placement relative to the object being monitored, the MiniPulse 500 can provide ESD event detection for specific small areas of interest or for wider area coverage.

The ESD detector presented uses a demodulating log amplifier 504 to measure signal power. The first stage of the threshold detector uses a slope determination algorithm as a comparator to determine ESD pulse qualification based upon a 350 ns envelope characteristic of the majority of ESD signal types.

The second stage of the detector rectifies the ESD signal, thereby ignoring positive or negative elements since ESD event peak amplitude is the only measurement of concern for discrimination purposes.

The third stage of the detector then compresses the ESD signal.

The fourth stage of the detector demodulates the signal across a 450 MHz spectrum.

The fifth stage of the detector is the peak amplitude measurement output given as the log of the rectified signal envelope.

The sixth and final stage is a threshold comparator 505 which evaluates the output signal amplitude to the variable threshold representing the demarcation of a valid ESD event signal.

The ESD event signal 650 is detected by an antenna 601 (shown as antenna 501 in FIG. 5) connected to shielded cable 651 and attached to an input connector (e.g., an input SMA connector). The signal (signal plus noise) is first passed through an attenuator 602. The attenuator 602 using data from the microprocessor controller 607 is programmed in 0.5 dB steps from zero to 15.5 dB. This allows the circuit to be adjusted to reduce the signal so that the noise falls below the detection threshold while leaving signals of interest detectable (discussed later).

The signal 653 from the attenuator 602 is then passed to a filter/integrator 603 (e.g., a 6 order RC (resistor-capacitor) high-pass filter) which is tuned to pass the distorted frequencies (>100 MHz) typical of a true ESD event and reject signals outside that frequency range. The filtered signal 654 (from the filter/integrator 603) is then passed to a log-amplifier 604, which is a very fast six stage demodulating log-amp (e.g., Analog Devices AD8310), and the log-amplifier 604 filters the incoming signal, and discriminates by power, duration, and amplitude. The log-amplifier 604 inverts its output signal so the stronger the input ESD event signal strength, the lower the log-amplifier's output voltage 652. Typically, this signal 652 will range between approximately 2.5V and approximately 1.0V.

A reference threshold voltage is generated using the +3.3V supply and a digital potentiometer 608 voltage divider. The digital potentiometer 608 is controlled by data from the microprocessor 607.

The output voltage 652 from the log-amplifier 604 is then compared to a preset DC voltage 655 from the digital potentiometer 608, using an ultra fast comparator 605 (e.g., Analog Devices AD8561).

If the comparator (AD8561) 605, detects a signal (on the "−" or negative input) which goes below reference voltage 655 (on the "+" or positive input) a negative true condition 656 is momentarily developed on the output of the comparator 605. This pulse 656 is then passed to the timing discriminator 606, comprising a pair of one-shot multi-vibrators 657*a* and 657*b*. One-shot vibrator 657*a* will be clocked on and Q=true (assuming the J input is true). When the one-shot pulse 656 resets (due to the RC timeout, of approximately 250 nSec (nanoSeconds)) the second one-shot vibrator 657*b* will set Q to true only provided the output 656 of comparator 605 has returned high because the output 656 of comparator 605 is a single, sufficiently fast pulse. If a pulse (in output 656) is too long in duration, e.g., >~500 nSec, thereby indicating that the pulse (in output 656) is not an ESD event of interest, then that pulse is ignored.

Therefore, the one-shot vibrator 657*b* causes Q to be set to true only because a pulse has been determined to be an ESD event of interest. The output of one-shot vibrator 657*b* then causes the counter 609 to "add 1" to any existing count already present in that counter 609.

Figure 7:
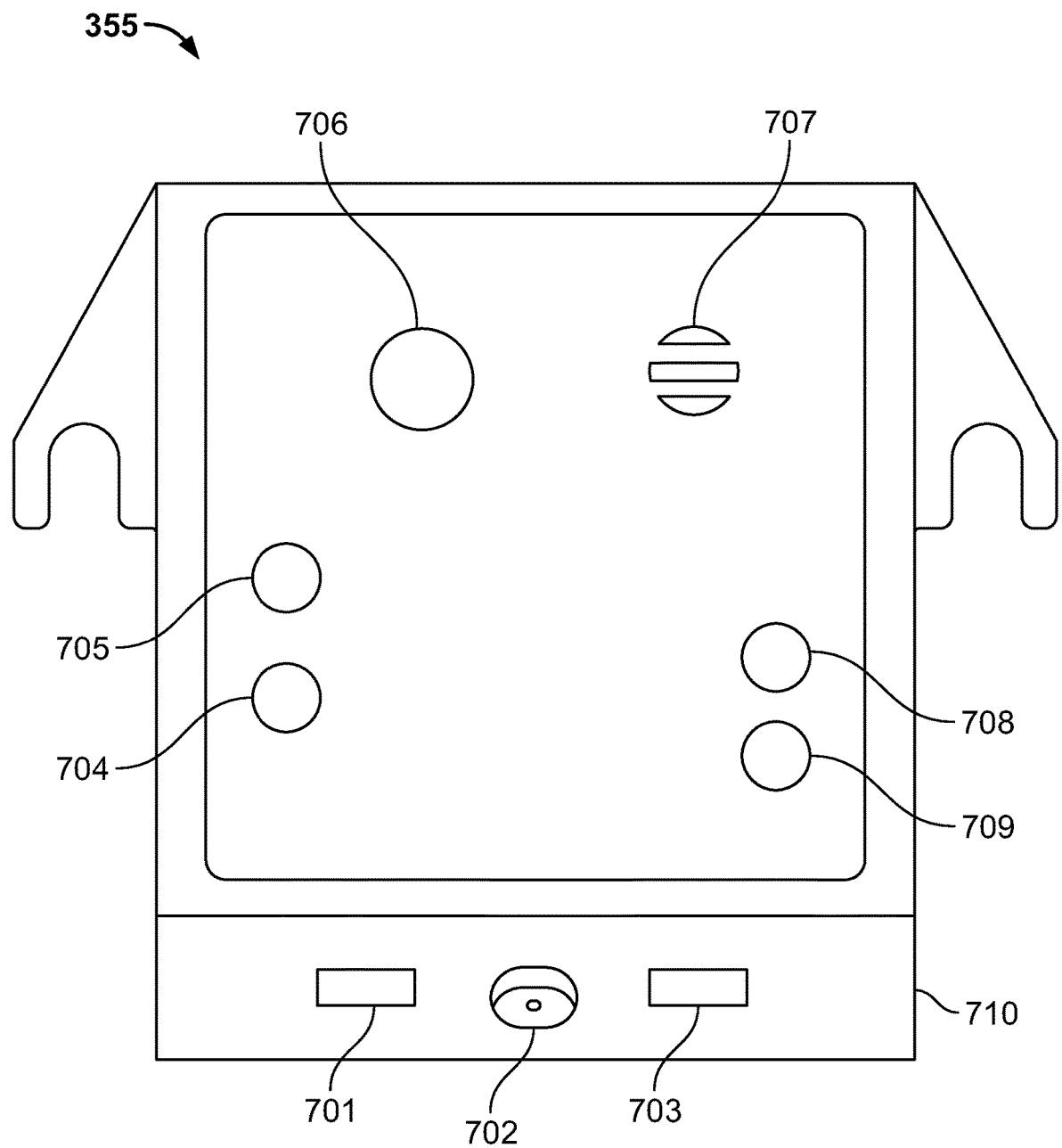
FIG. 7 is a block diagram of a general view of a MiniPulse ESD detector as seen externally in an embodiment of the invention.

FIG. 7 shows a general view of a MiniPulse ESD detector 355 as seen externally in one embodiment of the invention. The detector enclosure 710 has small dimensions of approximately 2.15"×2.1"×0.75". As previously discussed, the detector 355 can include a set of different antennas depending upon the object of in-situ ESD detection, tool, or/and monitoring task. However, the ESD detector 355 may have another type of configuration that differs from FIG. 7.

In one embodiment, the MiniPulse panel of detector 355 includes a 2-pin power connector 701 where approximately 7 VDC-24 VDC is typically provided to power the instrument (detector 355). The external antenna's coaxial cable (e.g., cable 404*d* in FIG. 4*a*) will be attached to the SMA (SubMiniature version A) connector 702 of the detector 355. A test point for ground 704 is provided by the detector 355. There is a test point 705 in the detector 355 where a voltmeter probe may be inserted to be used while adjusting and or checking the threshold level potentiometer 706 setting.

The ESD Event Alarm circuitry drives an Audible transducer which lies directly below the sound port 707, a pair of LED indicators 708 and 709 and the externally accessible output connector 703 in the detector 355. The green LED 708 indicates power is on and there is no alarm. As an example, when an ESD event is detected, the audible alarm 707 sounds, the green LED 708 is extinguished, the red LED 709 illuminates and the open collector Alarm Output 703 is pulled to ground.

An optional self-contained external LCD counter may be attached to the open collector Alarm Output 703 to register the total detected events until the count is cleared manually. Alternatively, the open collector Alarm Output 703 may be connected to some other circuit, e.g., a computer input, which may be used for machine control, communication, reporting, etc.

Figure 8A:
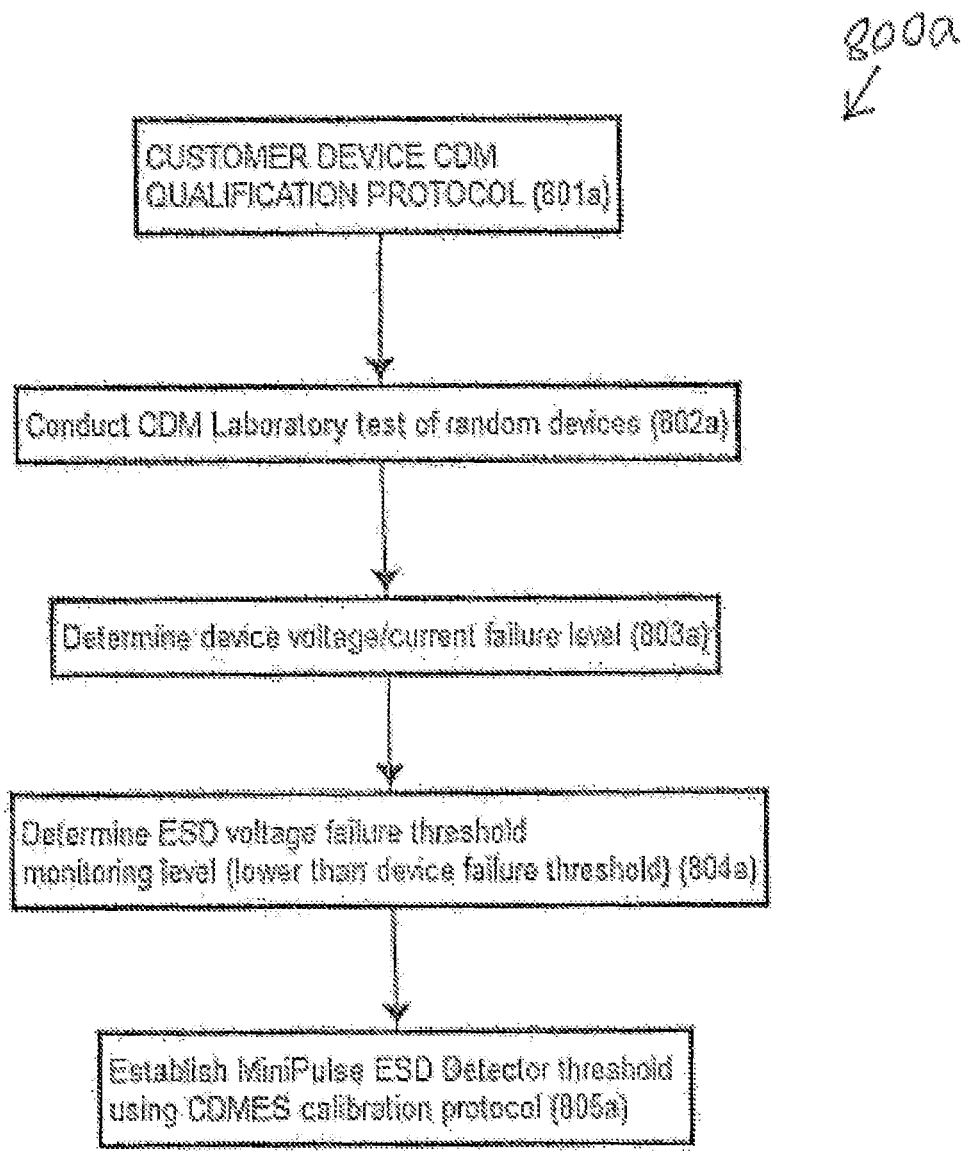
FIGS. 8a and 8b are flowcharts of a MiniPulse ESD calibration process, in accordance with an embodiment of the invention.

FIG. 8 is a flowchart of a calibration method 800*a* and implementation for an ESD detector, in accordance with an embodiment of the invention. It is noted that the order of the steps in the method 800*a* may vary, and some particular steps may also be performed concurrently. At 801*a* and 802*a* in the calibration method 800*a*, formal laboratory device CDM tests are performed on randomly sampled candidate devices. At 803*a*, a determination is performed on the device of interest voltage/current failure level. At 804*a*, a determination is made if the ESD voltage failure threshold monitoring level is lower than a device failure threshold. How much lower the ESD voltage failure threshold (than the device failure threshold) will be dependent on the device type and critical manufacturing process points for monitoring for presence of ESD events (examples: e.g., testers and/or handlers). At 805*a*, the method 800*a* comprises establishing a miniPulse ESD detector threshold using a CDMSES calibration protocol.

Figure 8B:
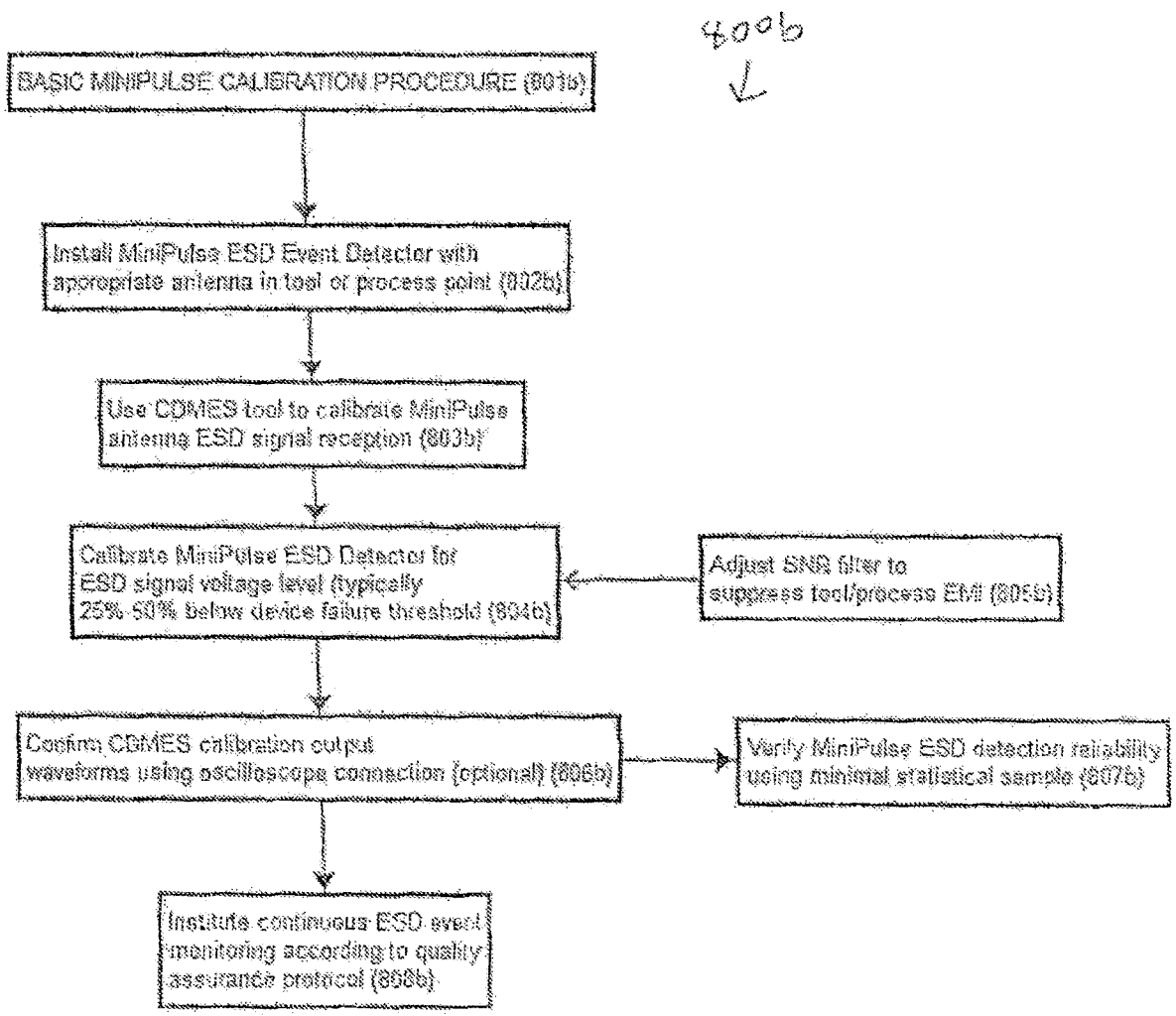

FIG. 8*b* also illustrates a flowchart of a MiniPulse ESD calibration process 800*b*, in accordance with one embodiment of the invention.

For process 800*b*, an in-situ ESD event calibration process is conducted with a CDM Event Simulator (CDMES). Examples of the in-situ ESD event calibration process have been described above with reference to the apparatus 350 in FIG. 3*a*.

At 801*b*, the basic MiniPulse calibration procedure starts.

At 802*b*, a MiniPulse ESD Event Detector with an appropriate antenna is installed in a tool or process point.

At 803*b*, a CDMES tool is used to calibrate a MiniPulse antenna ESD signal reception.

At 804*b*, the MiniPulse ESD Detector is calibrated for ESD signal voltage level (typically, approximately 25%-50% below a device failure threshold).

At 804*b*, a continuous ESD monitoring protocol may be instituted with a MiniPulse ESD detector to assure quality compliance.

When the MiniPulse ESD detector 355 is calibrated for a specific device withstand voltage threshold, this voltage/energy threshold will typically be set at a voltage level that is less than the actual voltage failure level of the device (at 804*b*). For example, if a device has an actual voltage failure level of approximately 200 volts, then the voltage threshold will be set below 200 volts such as, e.g., approximately 50% of the voltage failure level or approximately 100 volts. This approach prevents actual damages to occur in devices. Therefore, at 805*b*, an allowable applied voltage threshold is determined for each device type to be tested. At 805*b*, a signal-to-noise ratio (SNR) filter in the detector 355 is adjusted to suppress EMI in the tool and/or process.

At 806*b*, the CDMES calibration output waveforms may be confirmed using an oscilloscope connection (this procedure at 806*b* is optional).

At 807*b*, the MiniPulse ESD detection reliability may verified using a minimal statistical sample. The verification in 807*b* may be performed after the confirmation in 806*b* is performed.

At 808*b*, a continuous ESD event monitoring is instituted according to a quality assurance protocol.

At 808*b*, a minimum statistical sample/shot is applied for PASS/FAIL ESD event detection validation for each location. For example, about 20 or 30 shots are applied to obtain accurate calibration.

At 806*b*, an ESD detector 355 (e.g., a MiniPulse detector) is calibrated for a specific device withstand voltage threshold. It is noted that after the procedures in blocks 803*b*, 805*b*, and/or 808*b* are performed, the procedures in block 806*b* may then be performed.

The following discussion provides additional details on the sequence of the in-situ calibration process in one embodiment of the invention:

1. Place the MicroESD antenna 382 of the MiniPulse monitor (ESD detector 355) at closest practical proximity (e.g., 1") to the process point in the tool where the sensitive IC device will be placed.

2. Connect the MicroESD antenna cable (e.g., cable 404*d*) to the MiniPulse monitor 355.

3. Set the DC power supply voltage for the CDMES to the required threshold voltage level (typically approximately 50% of the IC device failure threshold).

4. Position the CDMES at the designated process point chosen for the IC device monitoring application.

5. Trigger the CDMES continually while adjusting the MiniPulse detection threshold control until the required ESD event detection threshold for the MiniPulse 355 is achieved.

6. Generate a minimal statistical group (e.g., 12-24) of CDMES discharges at the IC device specified threshold voltage to verify the MiniPulse detector performance.

7. Record the successful calibration data in the form of the CDMES DC voltage level, the number of successful MiniPulse detections during the statistical sampling group, and the MiniPulse threshold settings via the front panel test points with a digital multi-meter.

There is ambient tool/background noise, and there are ESD events outside of the application focal area which can interfere with detection of signals of interest. Therefore there are multiple noise sources to be considered.

This makes the Signal-to-Noise (SNR) ratio difficult to maintain for some applications.

Under some circumstances (SNR Collapse), the detector will not be able to function (i.e., separate target ESD signals from all sources of background interference).

Figure 9:
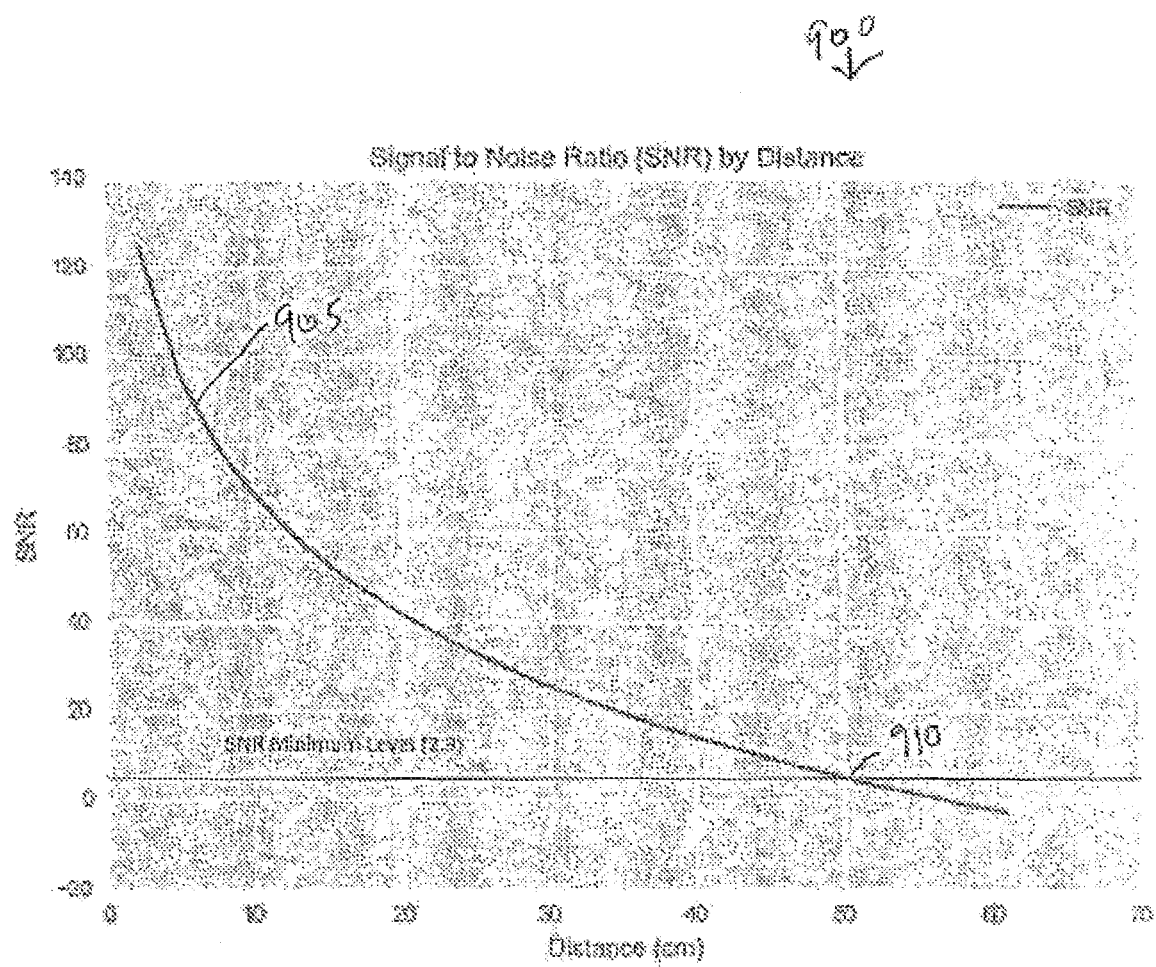
FIG. 9 is graph showing a signal to noise ratio dependence from distance between an object of ESD events monitoring and an antenna.

FIG. 9 is a graph 900 showing how ESD signal amplitude is reduced by distance from the detector antenna 382 (signal to noise ratio by distance), which makes the signal amplitude close to the noise amplitude. As the SNR collapses, it becomes difficult to separate the ESD signal from the noise signal.

Under some circumstances (SNR collapse), the detector will not be able to function (i.e., separate target ESD signals from all sources of background interference). For example, the example function 905 (SNR versus distance in centimeters) indicates (at point 910) an SNR minimum level of approximately 2.9 at a distance of approximately 50 centimeters from the source of the ESD.

Figure 10A:
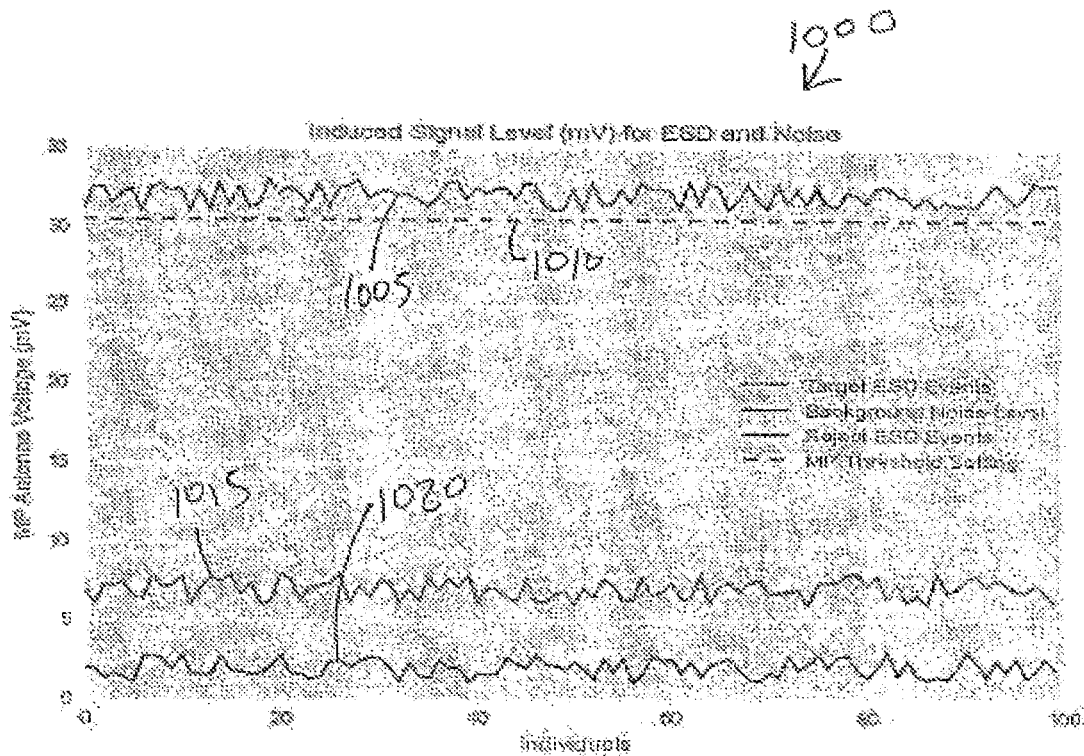
FIGS. 10a and 10b are graphs of an antenna output at different impedance/attenuation of the signal, in accordance with one embodiment of the invention.

FIG. 10*a* is a graph 1000 showing a basic 50 V/m CDMES calibration at approximately 1" distance with zero attenuation. Graph 1000 shows the following functions based on a millivolts (of the MiniPulse antenna 382) versus signal measurements that are occurring during the calibration procedure: Target ESD events 1005, background noise level 1010, rejected ESD events 1015, and MiniPulse threshold setting 1020.

Additionally, the following parameters 1025 are applicable in the graph 1000:
Attenuation Factor=0.0 (0.0 dB)
Rejection ESD Level=8.0 (mV)=50V/m @ 24"
Background Pulse Noise Level=3.0 (mV)
Recommended Antenna Threshold Setting (mV): 30.39
Maximum SNR (mV): 23.01
Note: This is an ideal circumstance.

Figure 10B:
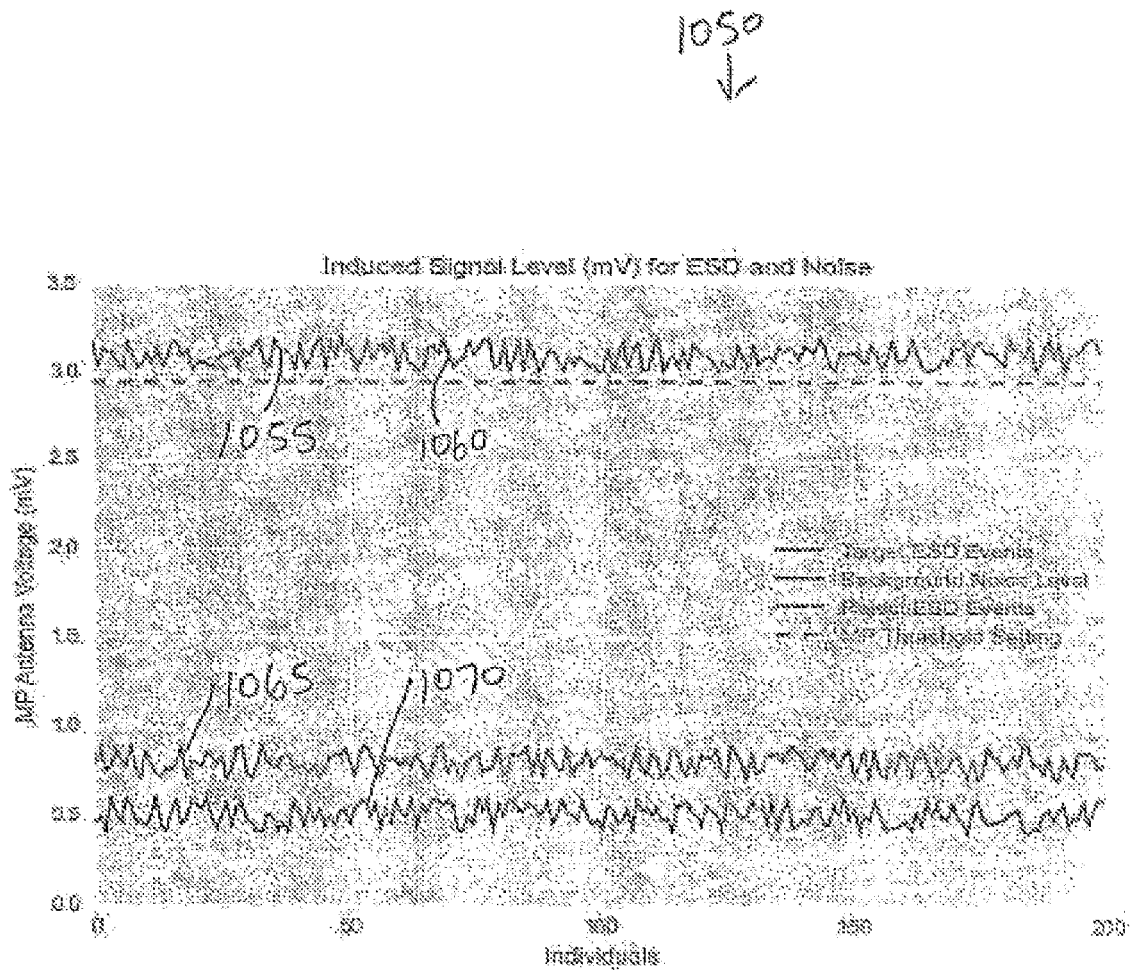

FIG. 10b is a graph 1050 showing an induced signal with approximately 10 dB attenuation. Graph 1050 shows the following functions based on a millivolts (of the MiniPulse antenna 382) versus signal measurements that are occurring during the calibration procedure: Target ESD events 1055, background noise level 1060, rejected ESD events 1065, and MiniPulse threshold setting 1070.

Additionally, the following parameters 1075 are applicable in the graph 1050:
Attenuation Factor=10.0 (10.0 dB)
Rejection ESD Level=0.9 (mV)=50V/m @ 24"/Attenuation Factor
Background Pulse Noise Level=0.6 (mV)
Maximum Antenna Threshold Setting (mV): 2.94.

This example (in FIG. 10b) shows that the SNR ratio is getting smaller. But both background noise and false ESD events are now rejected. Also the significant signal space left and maximum SNR (mV) is 2.91.

The signal-to-noise ratio (SNR), as mentioned above, can be very unfavorable for discriminating signals of interest (in this case ESD events caused by charged products) as the distance between the signal source and the interception point (of the signal from the signal source) grows. In general, electromagnetic tool noise created by electrical components is lower than the radiated amplitude of the ESD signals of interest.

However, without filtering, many of the ESD signal amplitudes as source distance increases are too close to the peak noise level to allow effective discrimination. The MiniPulse ESD detector 355 in its various forms has had signal time domain (duration) filtering and ESD signal threshold filtering since its inception. Whereas this has allowed a better resolution than other detectors, there have still been certain applications where noise levels have made this filtering approach problematic as well. With the addition of the noise filtering method described above, this has made SNR discrimination much more effective.

The MiniPulse ESD detector 355 has a proprietary electromagnetic noise filter to condition the input signal in high-noise environments. This variable impedance filter is an amplitude attenuation function for background broadband noise from all sources, but most commonly in automated tools. Automated tools commonly have variable levels of noise (EMI) from tool electrical components which can cause ESD signal interception problems. Usual methods for filtering electromagnetic signals involve band-pass filters, which attenuate signals by frequency.

The proprietary method cited herein uses digitally controlled variable impedance to attenuate general signal amplitude as a first threshold to remove radiated circuit noise below a given level. The MiniPulse ESD detector 355 also includes a second settable threshold (previously referenced) to act as an amplitude filter for ESD signals of interest.

Figure 11A:
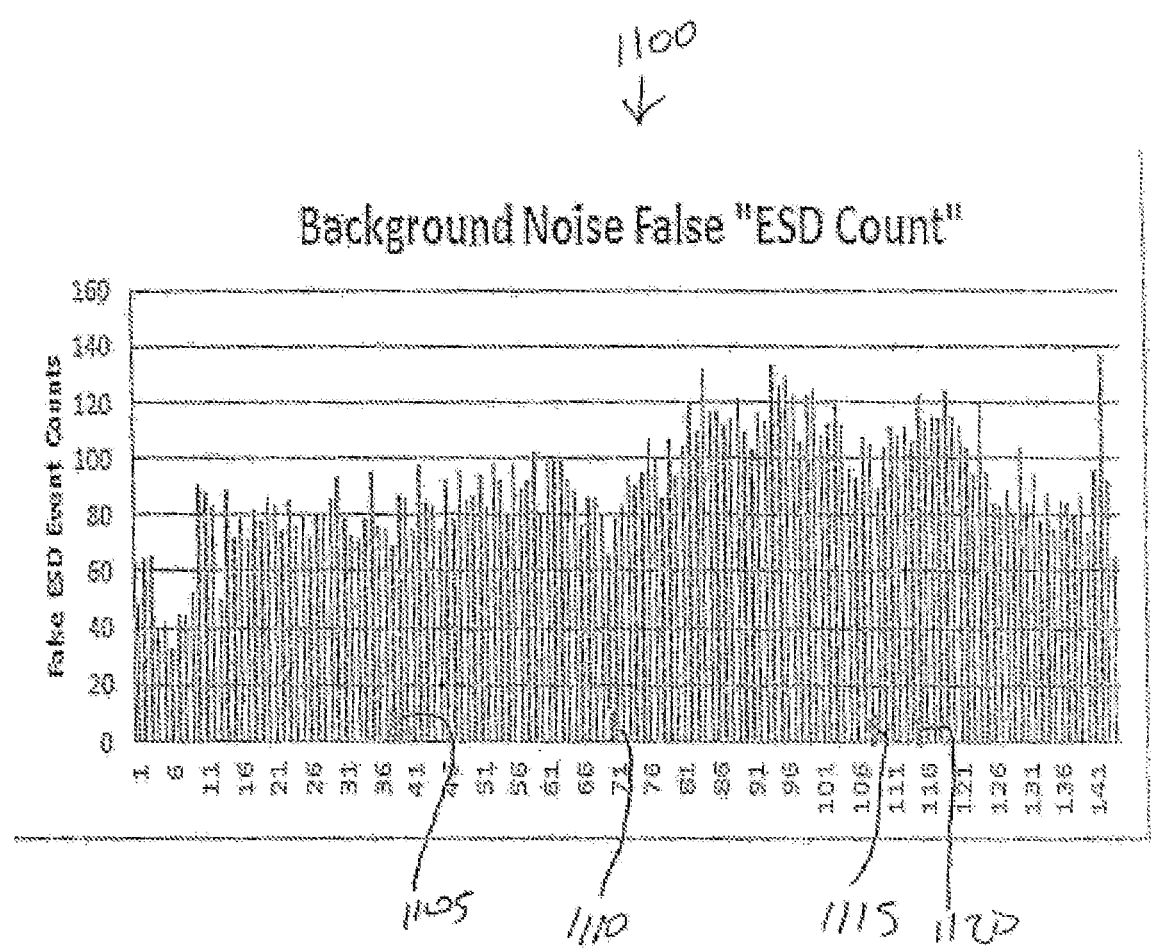
FIGS. 11a, 11b, and 11c are graphs of ESD events counts at different modes of signal filtering, in accordance with an embodiment of the invention.

FIG. 11a is a graph 1100 showing an example of unfiltered ambient pulse noise representing ESD pulse signal interference. This type of interference, common for other ESD detection systems, has made tool adaptation very difficult and often impossible. Actual embedded ESD events of interest are shown by the signals 1105, 1110, 1115, and 1120. Graph 1100 shows the number of false ESD event counts (background noise) on the Y-axis versus the counts of electrostatic discharge occurrences (ESD count) on the X-axis.

Figure 11B:
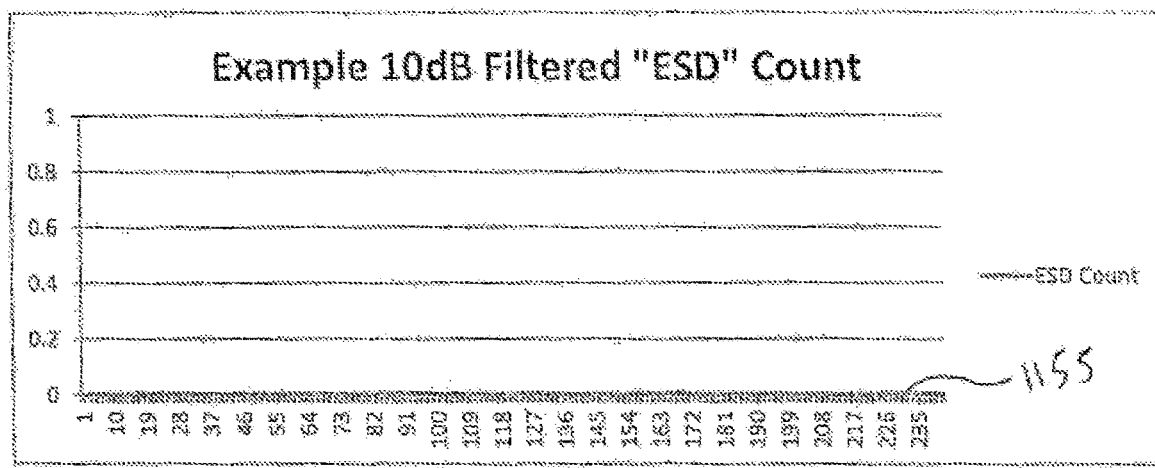

FIG. 11b is a graph 1150 showing the use of variable signal attenuation/impedance that allows the detector to effectively ignore ambient/tool noise. In particular, graph 1150 shows the ESD count 1155 based on decibel measurements versus the counts of electrostatic discharge occurrences.

Figure 11C:
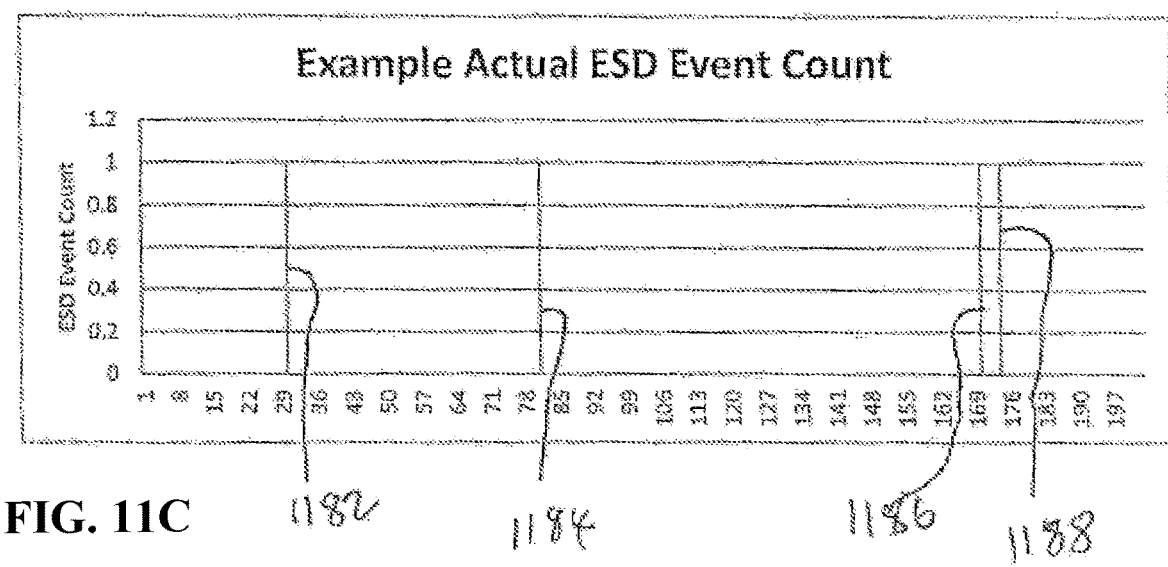

FIG. 11c is a graph 1180 showing that after variable impedance filtering has been applied, true ESD signals of interest can be easily separated from background noise levels. Shown in graph 1180 is a series of four (4) real ESD events 1182, 1184, 1186, and 1188 which would have been lost in the general noise of an unfiltered input to the ESD detector. The Y-axis of graph 1180 indicates an ESD event count and the X-axis of graph 1180 indicates the counts of electrostatic discharge occurrences.

The samples of in-situ calibration with selectively moving up or down of the attenuation factor (in practice, the threshold of monitoring energy levels) make possible to analyze real in-tool level signals and optimize the signal noise ratio (SNR) for each application.

In summary, the product, apparatus embodiments, and methods described herein provide real information on ESD events in tools and processes. This allows the customer to determine ESD event risk relating to product charge related vulnerabilities. Also, the product, apparatus embodiments, and methods described herein allow the customer to evaluate the need for remediation to eliminate the risk including possible tool ionization and other methods of neutralization or protection.

It is also understood that other systems according to an embodiment of the invention can have various forms and can have different components that are arranged in other ways or orientations.

Other variations and modifications of the above-described embodiments and methods are possible in light of the teaching discussed herein.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. An apparatus for detecting electrostatic discharges (ESD) events, the apparatus comprising:
   an ESD detector comprising an attenuator, the ESD detector being configured to detect an ESD event;
   a controller configured to:
      activate a process window in response to a signal corresponding to a command to process a device being handled or tested by a tool;
      activate the ESD detector to detect and report the ESD event occurring during the process window; and deactivate the process window and control the ESD detector to enter into a standby mode to ignore electromagnetic signals in response a signal corresponding to a command to end the process; and at least one antenna coupled to said ESD detector; wherein said ESD detector is calibrated for at least one discharge energy threshold or range of discharge energies by adjusting the attenuator to suppress electromagnetic interference (EMI) outside the at least one discharge energy threshold or the range of discharge energies detected during the process window.

2. The apparatus of claim 1, wherein the ESD detector is configured to measure a pulse duration of a received pulse in order to determine if the received pulse is an ESD event.

3. The apparatus of claim 1, wherein the ESD detector is configured to reject a received pulse that is less than a first pulse duration or is greater than second pulse duration.

4. The apparatus of claim 1, wherein the ESD detector is configured to reject a received pulse that is outside a frequency range.

5. The apparatus of claim 1, wherein the ESD detector is configured to filter a received pulse based on a power, duration, and amplitude of the received pulse.

6. The apparatus of claim 1, further comprising:
a charged device model event simulators (CDMES) unit comprising a first conductive part and a second conductive part;
wherein the first conductive part and the second conductive part differ in electrical potentials; and
wherein an input high voltage provides a charge to the first conductive part;
wherein the first conductive part is movable toward the second conductive part; and
wherein a CDM event is triggered as the first conductive part moves toward the second conductive part.

7. The apparatus of claim 1, wherein the at least one antenna comprises characteristics that allow an ESD radiated energy to be directionally detected and suppress other events not of interest.

8. The apparatus of claim 1, wherein the ESD event occurs in a tool process area.

9. The apparatus of claim 8, wherein:
said tool process area comprises a first process area and a second process area;
said at least one antenna comprises a first antenna coupled to said ESD detector and a second antenna coupled to said ESD detector; and
said first antenna positioned in said first process area and said second antenna positioned in said second process area.

10. A method for detecting electrostatic discharges (ESD) events, the method comprising:
calibrating the ESD detector for at least one discharge energy threshold;

activating, via a controller, a process window in response to a signal corresponding to a command to process a device being handled or tested by a tool;
activating the ESD detector to detect and report the ESD event occurring during the process window;
during the process window, detecting an ESD event via the ESD detector;
adjusting a signal to noise ratio via a signal to noise filter of the ESD detector to suppress electromagnetic interference (EMI) outside the least one discharge energy threshold detected during the process window; and
deactivating the process window via the controller and controlling the ESD detector to ignore electromagnetic signals based in part on the adjusted signal to noise ratio.

11. The method of claim 10, wherein the ESD detector is configured to measure a pulse duration of a received pulse in order to determine if the received pulse is an ESD event.

12. The method of claim 10, wherein the ESD detector is configured to reject a received pulse that is less than a first pulse duration or is greater than second pulse duration.

13. The method of claim 10, wherein the ESD detector is configured to reject a received pulse that is outside a frequency range.

14. The method of claim 10, wherein the ESD detector is configured to filter a received pulse based on a power, duration, and amplitude of the received pulse.

15. The method of claim 10, further comprising:
triggering an ESD event as a first conductive part moves toward a second conductive part;
wherein the first conductive part and the second conductive part differ in electrical potentials; and
wherein an input high voltage provides a charge to the first conductive part; and
wherein the first conductive part is movable toward the second conductive part.

16. The method of claim 10, further comprising:
allowing, by the at least one antenna, an ESD radiated energy to be directionally detected and suppressing, by the at least one antenna, other events not of interest outside the least one discharge energy threshold.

17. The method of claim 10, wherein the ESD events occur in a tool process area.

18. The method of claim 17, wherein:
said tool process area comprises a first process area and a second process area;
said at least one antenna comprises a first antenna coupled to said ESD detector and a second antenna coupled to said ESD detector; and
said first antenna positioned in said first process area and said second antenna positioned in said second process area.

* * * * *